US012610621B2

(12) United States Patent
Yeh et al.

(10) Patent No.: US 12,610,621 B2
(45) Date of Patent: Apr. 21, 2026

(54) DISPLAY PANEL HAVING STORAGE CAPACITORS AND MANUFACTURING METHOD THEREOF

(71) Applicant: HannStar Display Corporation, Taipei City (TW)

(72) Inventors: Cheng-Yen Yeh, Taichung City (TW); Yen-Chung Chen, Taichung City (TW); Mu-Kai Kang, Tainan City (TW); Jing-Xuan Chen, Tainan City (TW); Qi-En Luo, Chiayi County (TW)

(73) Assignee: HannStar Display Corporation, Taipei City (TW)

( * ) Notice: Subject to any disclaimer, the term of this patent is extended or adjusted under 35 U.S.C. 154(b) by 386 days.

(21) Appl. No.: 18/314,139

(22) Filed: May 9, 2023

(65) Prior Publication Data

US 2023/0411407 A1     Dec. 21, 2023

(30) Foreign Application Priority Data

Jun. 15, 2022    (CN) ......................... 202210685060.6

(51) Int. Cl.
*G02F 1/1333*        (2006.01)
*G02F 1/1343*        (2006.01)
(Continued)

(52) U.S. Cl.
CPC ....... *H10D 86/60* (2025.01); *G02F 1/133345* (2013.01); *G02F 1/13439* (2013.01);
(Continued)

(58) Field of Classification Search
None
See application file for complete search history.

(56) References Cited

U.S. PATENT DOCUMENTS

| | | | |
|---|---|---|---|
| 8,040,487 B2 | 10/2011 | Hayashi |
| 8,115,893 B2 | 2/2012 | Jung et al. |

(Continued)

FOREIGN PATENT DOCUMENTS

| | | |
|---|---|---|
| CN | 1287343 | 3/2001 |
| CN | 105977261 | 9/2016 |

(Continued)

OTHER PUBLICATIONS

"Office Action of Taiwan Counterpart Application", issued on Mar. 19, 2024, p. 1-p. 5.

(Continued)

*Primary Examiner* — Sue A Purvis
*Assistant Examiner* — Seyon Ali-Simah Punchbeddell
(74) *Attorney, Agent, or Firm* — JCIPRNET

(57)        ABSTRACT

A display panel including a substrate, scan lines, data lines, and pixel structures is provided. The pixel structures are electrically connected to the data lines and the scan lines. Each pixel structure includes an active device, a pixel electrode, a capacitor electrode, a common electrode, an overcoat layer, a first passivation layer and a second passivation layer. The active device is electrically connected to the pixel electrode. The capacitor electrode is electrically connected to the pixel electrode. The common electrode is located between the capacitor electrode and the pixel electrode. The common electrode, the capacitor electrode and the pixel electrode overlap with each other. The overcoat layer is disposed between the common electrode and the first passivation layer. The second passivation layer is disposed between the common electrode and the pixel electrode.

14 Claims, 22 Drawing Sheets

10

(51) Int. Cl.

| | | |
|---|---|---|
| *G02F 1/1362* | (2006.01) |
| *G02F 1/1368* | (2006.01) |
| *H10D 86/01* | (2026.01) |
| *H10D 86/40* | (2025.01) |
| *H10D 86/60* | (2025.01) |

(52) U.S. Cl.

CPC .. *G02F 1/136213* (2013.01); *G02F 1/136286* (2013.01); *G02F 1/1368* (2013.01); *H10D 86/0231* (2025.01); *H10D 86/443* (2025.01); *H10D 86/481* (2025.01)

(56) References Cited

U.S. PATENT DOCUMENTS

| | | | |
|---|---|---|---|
| 2016/0188061 | A1 | 6/2016 | Cho et al. |
| 2016/0370678 | A1 | 12/2016 | Ono |
| 2017/0343873 | A1* | 11/2017 | Ma ................... G02F 1/136213 |
| 2019/0189636 | A1 | 6/2019 | Gang |
| 2019/0227397 | A1 | 7/2019 | Wang et al. |

FOREIGN PATENT DOCUMENTS

| | | | | | |
|---|---|---|---|---|---|
| CN | 108153021 | | 6/2018 | | |
| CN | 113611712 | | 11/2021 | | |
| KR | 20040031369 | A * | 4/2004 | ........... | G02F 1/1368 |
| TW | 201624458 | | 7/2016 | | |
| TW | 201626357 | | 7/2016 | | |
| TW | 202212943 | | 4/2022 | | |
| TW | I771244 | B * | 7/2022 | | |

OTHER PUBLICATIONS

"Office Action of China Counterpart Application", issued on Jan. 28, 2026, p. 1-p. 11.

* cited by examiner

DISPLAY PANEL HAVING STORAGE CAPACITORS AND MANUFACTURING METHOD THEREOF

CROSS-REFERENCE TO RELATED APPLICATION

This application claims the priority benefit of China application serial no. 202210685060.6, filed on Jun. 15, 2022. The entirety of the above-mentioned patent application is hereby incorporated by reference herein and made a part of this specification.

BACKGROUND

Technical Field

The invention relates to a display panel and a manufacturing method thereof, and particularly relates to a display panel with a storage capacitor and a manufacturing method thereof.

Description of Related Art

A pixel structure is the smallest driving unit configured in a display panel to present images. Most of the pixel structures are provided with a storage capacitor to keep a driving signal of the pixel structure at a certain level within a predetermined time interval. A space available for layout of the storage capacitor is compressed as a size of the pixel structure is continuously reduced to achieve better display quality. Therefore, how to increase a storage capacitance within a limited space without affecting operational electrical properties of other components is a technical issue to be addressed by panel manufacturers.

SUMMARY

The invention is directed to a display panel, which has better operational electrical properties.

The invention is directed to a manufacturing method of a display panel, which has a better process yield.

According to an embodiment of the invention, a display panel includes a substrate, a plurality of scan lines, a plurality of data lines, a plurality of pixel structures, an overcoat layer, a first passivation layer, and a second passivation layer. The scan lines and the data lines are disposed on the substrate and are intersected with each other. The pixel structures are disposed on the substrate, and are electrically connected to the data lines and the scan lines. Each pixel structure includes an active device, a pixel electrode, a capacitor electrode, a common electrode, the first passivation layer, the overcoat layer, and the second passivation layer. The active device has a gate electrode, a source, and a drain. The gate electrode is electrically connected to one of the scan lines. The source is electrically connected to one of the data lines. The pixel electrode is electrically connected to the drain of the active device. The capacitor electrode extends from the drain and is electrically connected to the pixel electrode. The common electrode overlaps the pixel electrode and the capacitor electrode, and is located between the capacitor electrode and the pixel electrode. The overcoat layer is disposed between the common electrode and the capacitor electrode. The first passivation layer is disposed between the capacitor electrode and the overcoat layer. The second passivation layer is disposed between the common electrode and the pixel electrode.

In the display panel according to an embodiment of the invention, the capacitor electrode and the common electrode have a first distance therebetween in a stacking direction. The common electrode and the pixel electrode have a second distance therebetween in the stacking direction, the first distance is greater than the second distance, the stacking direction is perpendicular to an upper surface of the substrate, and the capacitor electrode, and the common electrode and the pixel electrode are disposed above the upper surface of the substrate.

In the display panel according to an embodiment of the invention, a sum of a thickness of the overcoat layer and a thickness of the first passivation layer is greater than a thickness of the second passivation layer.

In the display panel according to an embodiment of the invention, the common electrode is a second common electrode, each of the pixel structures further includes a first common electrode overlapping the capacitor electrode, the first common electrode is located between the substrate and the capacitor electrode, and the first common electrode is electrically coupled to the capacitor electrode and forms a first storage capacitor.

In the display panel according to an embodiment of the invention, the capacitor electrode is electrically coupled to the common electrode and forms a second storage capacitor, and the common electrode is electrically coupled to the pixel electrode and forms a third storage capacitor.

In the display panel according to an embodiment of the invention, a capacitance value of the third storage capacitor is greater than a capacitance value of the second storage capacitor.

In the display panel according to an embodiment of the invention, an overlapping area between the common electrode and the pixel electrode is larger than an overlapping area between the common electrode and the capacitor electrode.

In the display panel according to an embodiment of the invention, the common electrode further overlaps and covers one of the plurality of data lines.

In the display panel according to an embodiment of the invention, each of the pixel structures further includes a reflective layer electrically connected to the pixel electrode, and each of the pixel structures has a reflective region, where in each of the pixel structures, the reflective layer is located in the reflective region, and the reflective layer overlaps and covers at least a part of the pixel electrode in the reflective region.

In the display panel according to an embodiment of the invention, each of the pixel structures further has a transmissive region. In each of the pixel structures, the reflective layer overlaps and covers the part of the pixel electrode in the reflective region, and another part of the pixel electrode is located in the transmissive region.

In the display panel according to an embodiment of the invention, the first passivation layer and the second passivation layer have a contact hole. The contact hole exposes a part of the capacitor electrode, and the pixel electrode is electrical connected with the capacitor electrode through the contact hole.

In the display panel according to an embodiment of the invention, the overcoat layer has an opening overlapping the capacitor electrode. The second passivation layer and the pixel electrode extend into the opening.

According to an embodiment of the invention, a manufacturing method of a display panel includes: forming a metal layer on a substrate, forming a first passivation material layer on the metal layer, forming an overcoat layer on the first passivation material layer, forming another metal layer on the overcoat layer, forming a second passivation material layer on the another metal layer, etching the first passivation material layer and the second passivation material layer to form a first passivation layer and a second passivation layer having a contact hole, and forming a pixel electrode on the second passivation layer. The metal layer includes a capacitor electrode. The overcoat layer has an opening overlapping the capacitor electrode. The opening exposes a part of the first passivation material layer. The another metal layer includes a common electrode overlapping the capacitor electrode. The second passivation material layer extends into the opening and covers the first passivation material layer. The contact hole exposes a part of the capacitor electrode. The pixel electrode extends into the opening and is electrically connected with the capacitor electrode through the contact hole.

In the manufacturing method according to an embodiment of the invention, the metal layer is a second metal layer, and the another metal layer is a third metal layer. Before the step of forming the second metal layer, the method further includes: forming a first metal layer on the substrate, where the first metal layer includes a first common electrode; and forming an insulating layer on the first metal layer. The second metal layer is located on the insulating layer.

In the manufacturing method according to an embodiment of the invention, a material of the overcoat layer includes a photosensitive material. The step of forming the overcoat layer includes forming an overcoat material layer on the first passivation layer, and performing an exposure process and a development process on the overcoat material layer and removing a part of the overcoat material layer to form the opening.

In the manufacturing method according to an embodiment of the invention, the step of etching the first passivation material layer and the second passivation material layer to form the contact hole is performed in a same lithography and etching process.

In the manufacturing method according to an embodiment of the invention, the manufacturing method further includes forming a reflective layer on the pixel electrode. The reflective layer is electrically connected to the pixel electrode.

Based on the above descriptions, in the display panel and the manufacturing method thereof according to the embodiments of the invention, the first passivation layer and the overcoat layer are disposed between the second metal layer including the capacitor electrode and the third metal layer including the second common electrode, and the second passivation layer is disposed between the third metal layer and the pixel electrode. Since the distance between the second metal layer and the third metal layer is larger than the distance between the third metal layer and the pixel electrode, in addition to reducing a capacitance coupling effect between the two metal layers, the capacitance coupling effect between the third metal layer and the pixel electrode may also be increased. In addition, by disposing the first passivation layer between the second metal layer and the overcoat layer, a problem of peeling off between the overcoat layer and the second metal layer due to insufficient adhesive force is avoided.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1:
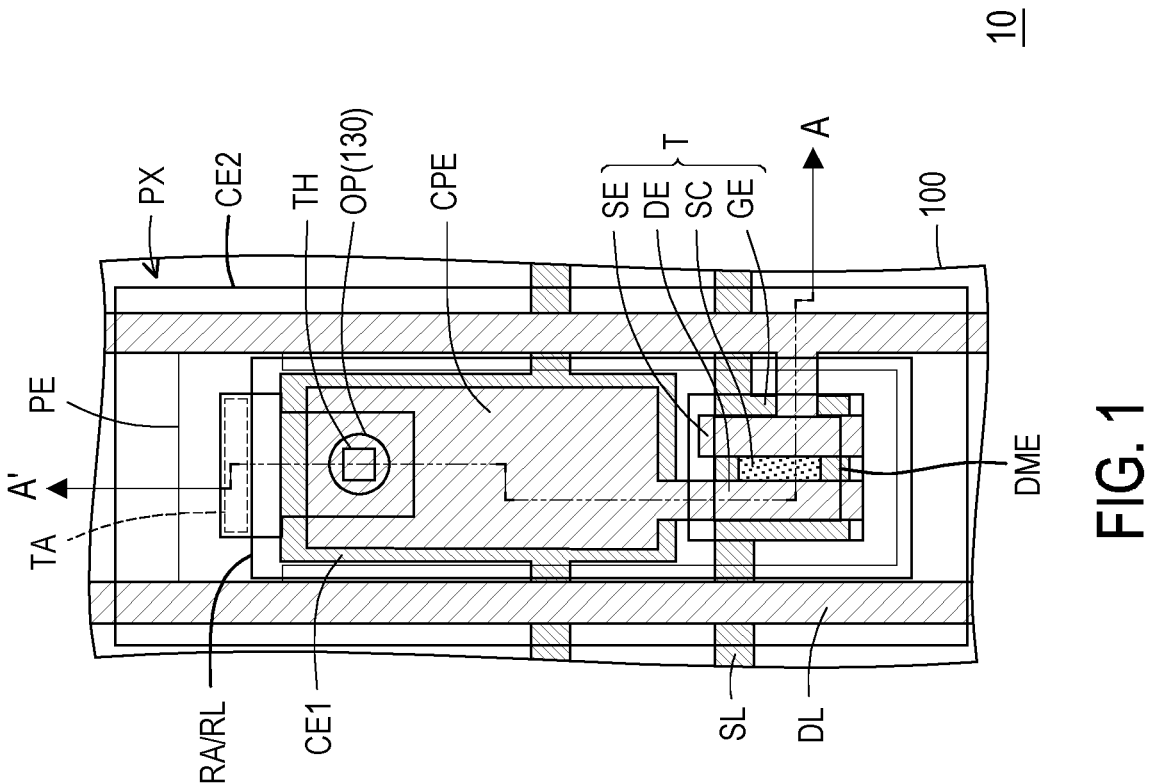
FIG. 1 is a schematic top view of a display panel according to a first embodiment of the invention.
Figure 1:
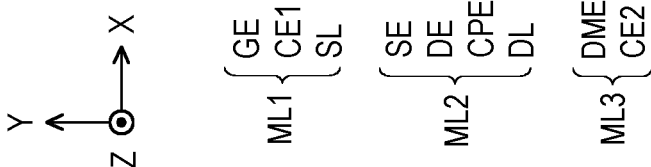

Reference will now be made in detail to the present preferred embodiments of the invention, examples of which are illustrated in the accompanying drawings. Wherever possible, the same reference numbers are used in the drawings and the description to refer to the same or like parts.

Figure 2:
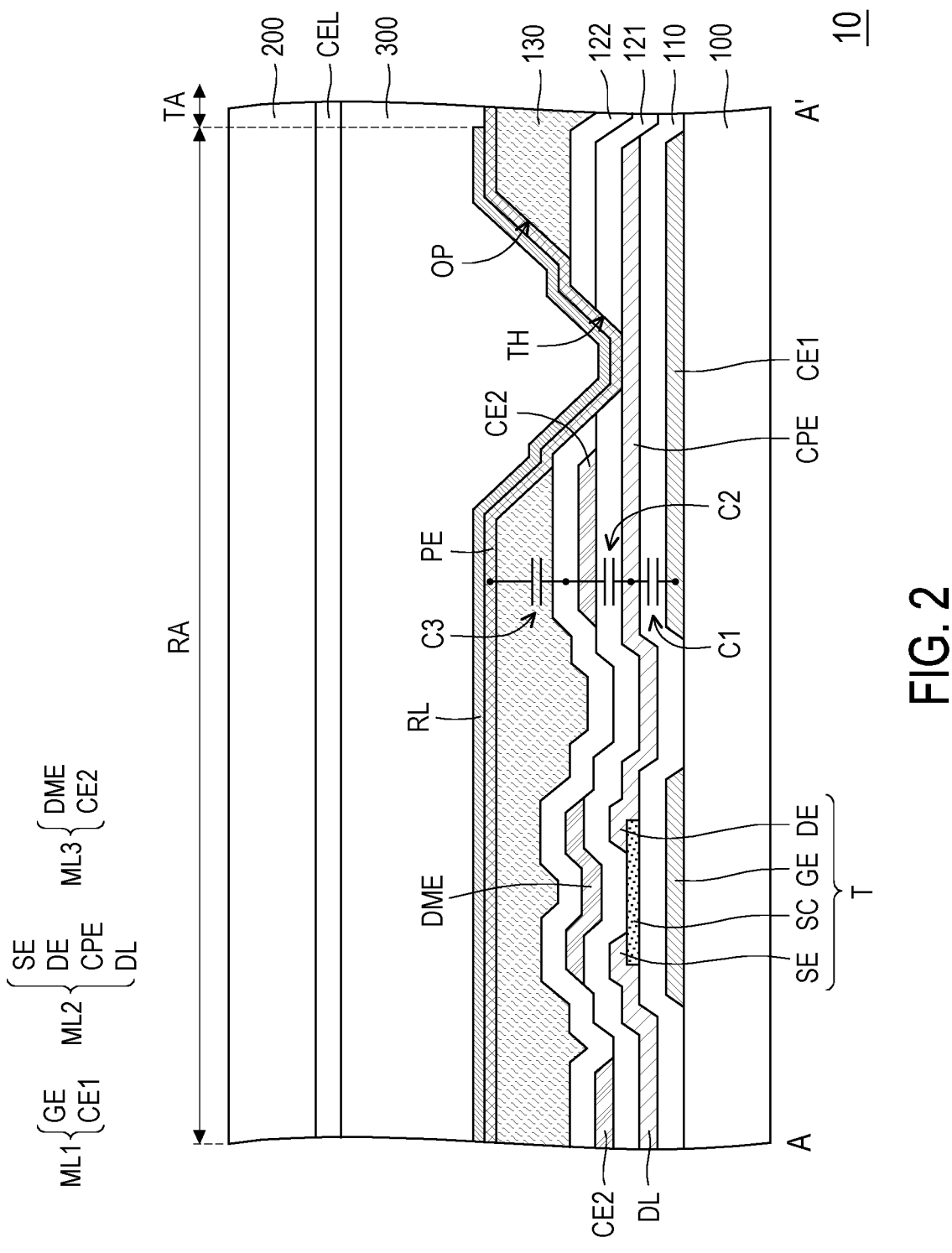
FIG. 2 is a schematic cross-sectional view of the display panel of FIG. 1.

FIG. 1 is a schematic top view of a display panel according to a first embodiment of the invention. FIG. 2 is a schematic cross-sectional view of the display panel of FIG. 1. FIG. 3A to FIG. 3H are schematic top views of patterns of each film layer of the display panel of FIG. 1. FIG. 4A to FIG. 4E are schematic cross-sectional views of a manufacturing process of the display panel of FIG. 1. FIG. 2 corresponds to a line A-A' in FIG. 1. For the sake of clarity, FIG. 1 omits illustration of a substrate 200 and a display medium layer 300 in FIG. 2.

Referring to FIG. 1 and FIG. 2, a display panel 10 includes a pixel array substrate, a substrate 200 and a display medium layer 300. The display medium layer 300 is disposed between the pixel array substrate and the substrate 200. In the embodiment, the display medium layer 300 is, for example, a liquid crystal layer. Namely, the display panel 10 of the embodiment is a liquid crystal display panel, but the invention is not limited thereto.

The pixel array substrate includes a substrate 100 and a plurality of scan lines SL, a plurality of data lines DL and a plurality of pixel structures PX disposed on the substrate 100. The pixel structure PX is electrically connected to one of the scan lines SL and one of the data lines DL. It should be noted that FIG. 1 only shows one display unit of the display panel 10, and the display panel 10 may be formed by arranging a plurality of the display units. For example, the plurality of data lines DL may be arranged along a direction X, each of the data lines DL may extend in a direction Y, the plurality of scan lines SL may be arranged along the direction Y, and each of the scan lines SL may extend in the direction X, where the direction X is optionally perpendicular to the direction Y. The plurality of pixel structures PX may be arranged in a plurality of columns and rows along the directions X and Y, respectively.

The pixel structure PX includes an active device T, a first common electrode CE1, a capacitor electrode CPE, a second common electrode CE2 and a pixel electrode PE. The active device T has a source SE, a drain DE, a gate GE and a semiconductor pattern SC. The source SE is electrically connected to a corresponding data line DL. The drain DE is electrically connected to the capacitor electrode CPE. The gate GE is electrically connected to a corresponding scan line SL. More specifically, an extending portion of the scan line SL corresponding to the pixel structure may be used as the gate GE of the active device T, and an extending portion of the data line DL corresponding to the pixel structure PX may be used as the source SE of the active device T. The capacitor electrode CPE extends from the drain DE and is electrically connected to the pixel electrode PE.

The first common electrode CE1 is disposed between the capacitor electrode CPE and the substrate 100, and overlaps the capacitor electrode CPE along a direction Z. The second common electrode CE2 is disposed between the capacitor electrode CPE and the pixel electrode PE, and overlaps the pixel electrode PE and the capacitor electrode CPE along the direction Z. For example, the first common electrode CE1 may be electrically coupled to the capacitor electrode CPE and form a first storage capacitor C1 (i.e., the first storage capacitor C1 is formed by the first common electrode CE1, the capacitor electrode CPE, and at least one insulating film layer located between the above two electrodes). The capacitor electrode CPE may be electrically coupled to the second common electrode CE2 and form a second storage capacitor C2 (i.e., the second storage capacitor C2 is formed by the capacitor electrode CPE, the second common electrode CE2 and at least one insulating film layer located between the above two electrodes). The second common electrode CE2 may be electrically coupled to the pixel electrode PE and form a third storage capacitor C3 (i.e., the third storage capacitor C3 is formed by the second common electrode CE2, the pixel electrode PE, and at least one insulating film layer between the above two electrodes). More specifically, the storage capacitor of the pixel structure PX may be formed by connecting the first storage capacitor C1, the second storage capacitor C2 and the third storage capacitor C3 in parallel. For example, the first storage capacitor C1 is formed by the first common electrode CE1, the capacitor electrode CPE and an insulating layer 110 located between the first common electrode CE1 and the capacitor electrode CPE. The second storage capacitor C2 is formed by the capacitor electrode CPE, the second common electrode CE2 and a first passivation layer 121 located between the capacitor electrode CPE and the second common electrode CE2. The third storage capacitor C3 is formed by the second common electrode CE2, the pixel electrode PE, and a second passivation layer 122 and an overcoat layer 130 located between the second common electrode CE2 and the pixel electrode PE.

In the embodiment, the pixel structure PX may have a reflective region RA and a transmissive region TA. The pixel structure PX may further include a reflective layer RL located in the reflective region RA, and the reflective layer RL covers and is electrically connected to the pixel electrode PE. From another point of view, the reflective region RA of the pixel structure PX may be defined by the location of the reflective layer RL. It should be particularly noted that a part of the pixel electrode PE overlaps the reflective layer RL in the reflective region RA, and another part overlaps the transmissive region TA. Namely, the display panel 10 of the embodiment may be a transflective display panel. However, the invention is not limited thereto. According to other embodiments, the pixel structure may only have the reflective region RA without the transmissive region TA, i.e., the display panel may also be a reflective display panel.

On the other hand, in order to reduce a coupling effect between the active device T and the pixel electrode PE to prevent a potential of the pixel electrode PE from causing turning-on of the active device T to cause leakage, a dummy electrode DME may be further provided between the active device T and the pixel electrode PE. The dummy electrode DME overlaps the active device T along the direction Z. For example, the dummy electrode DME may have a floating potential, but the invention is not limited thereto.

Moreover, the display panel 10 may further include a common electrode layer CEL disposed on a surface of the substrate 200 facing the display medium layer 300, i.e., the common electrode layer CEL is located between the substrate 200 and the display medium layer 300. For example, in the embodiment of the transflective display panel, the common electrode layer CEL is located in the reflective region RA and the transmissive region TA; in the embodiment of the reflective display panel without the transmissive region TA, the common electrode layer CEL is located in the reflective region RA. A material of the common electrode layer CEL may include a transparent conductive material, and the transparent conductive material may include, for example, metal oxide (for example, indium tin oxide, indium zinc oxide, aluminum tin oxide, aluminum zinc oxide, or other suitable oxides, or a stacked layer of at least two of the above oxides), but the invention is not limited thereto. For example, the display medium layer 300 is, for example, a liquid crystal layer, and an electric field formed between the pixel electrode PE and the common electrode layer CEL may control a direction of liquid crystal molecules in the display medium layer 300 to display a corresponding image. In the embodiment, the common electrode layer CEL, the first common electrode CE1 and the second common electrode CE2 may receive a common voltage, but the invention is not limited thereto.

A manufacturing method of the display panel 10 will be exemplarily described below.

Figures 3A, 3B:
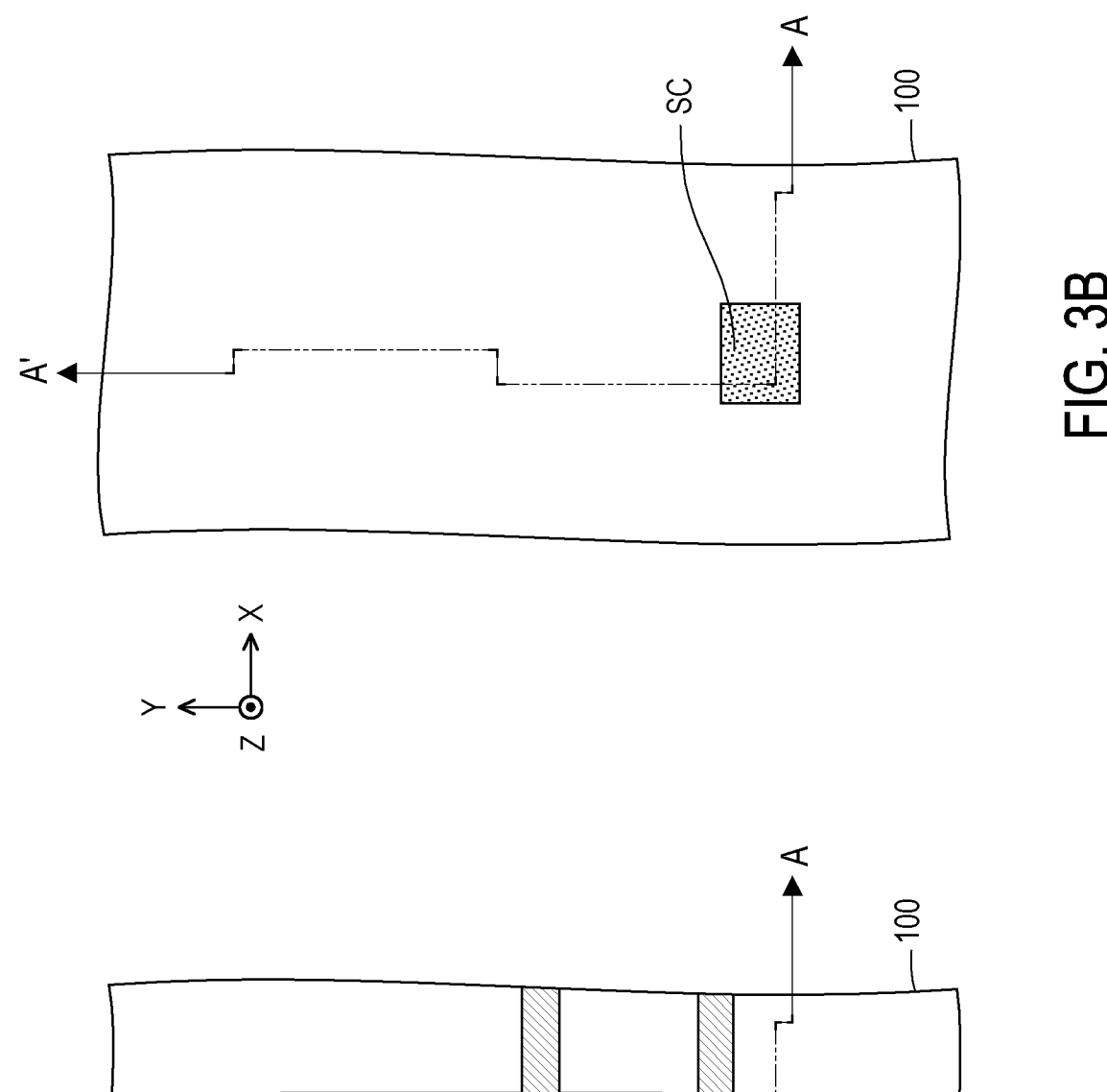
FIG. 3A to FIG. 3H are schematic top views of patterns of each film layer of the display panel of FIG. 1.

Referring to FIG. 3A-FIG. 3C and FIG. 4A, first, a first metal layer ML1 is formed on the substrate 100. FIG. 3A is a schematic top view of the first metal layer ML1. In the embodiment, the first metal layer ML1 includes the scan line SL (as shown in FIG. 1), the gate GE and the first common electrode CE1. A material of the substrate 100 is, for example, glass, quartz, polymer, or other suitable plates. A material of the first metal layer ML1 may include metals (for example, molybdenum, aluminum, copper, nickel, chromium), alloys, nitrides of metal materials, oxides of metal materials, oxynitrides of metal materials, or other suitable materials, or a stacked layer of metal materials and other conductive materials.

The insulating layer 110 is formed on the first metal layer ML1. The insulating layer 110 is, for example, a gate insulating layer, and a material thereof may include silicon oxide, silicon nitride or other suitable dielectric materials. The semiconductor pattern SC and a second metal layer ML2 are formed on the insulating layer 110. FIG. 3B is a schematic top view of the semiconductor pattern SC, and FIG. 3C is a schematic top view of the second metal layer ML2. In the embodiment, the second metal layer ML2 includes the data line DL (as shown in FIG. 1), the source SE, the drain DE and the capacitor electrode CPE. The capacitor electrode CPE overlaps the first common electrode CE1 of the first metal layer ML1.

The semiconductor pattern SC may be used as a channel layer of the active device T, and the source SE and the drain DE are respectively electrically connected to two different regions of the semiconductor pattern SC. The gate GE, the source SE, the drain DE and the semiconductor pattern SC may constitute the active device T. A material of the semiconductor pattern SC may include an amorphous silicon semiconductor, a monocrystalline silicon semiconductor, a polycrystalline silicon semiconductor, or a metal oxide semiconductor. In the embodiment, the active device T is, for example, an amorphous silicon thin film transistor (a-Si TFT), but the invention is not limited thereto. In other embodiments, the active device T may also be a polycrystalline silicon TFT (poly-Si TFT) or a metal oxide semiconductor TFT. In some embodiments, an ohmic contact layer may also be provided between the source SE and the semiconductor pattern SC and between the drain DE and the semiconductor pattern SC, and a material of the ohmic contact layer may be, for example, a doped amorphous silicon layer, but the invention is not limited thereto.

In the embodiment, the gate GE is optionally disposed below the semiconductor pattern SC to form a bottom-gate thin-film-transistor, but the invention is not limited thereto. In other embodiments, the gate GE may also be disposed above the semiconductor pattern SC to form a top-gate thin-film-transistor. A material of the second metal layer ML2 may include metals (for example, molybdenum, aluminum, copper, nickel, chromium), alloys, nitrides of metal materials, oxides of metal materials, oxynitrides of metal materials, or other suitable materials, or a stacked layer of metal materials and other conductive materials. Then, a first passivation material layer 121M is formed on the second metal layer ML2. A material of the first passivation material layer 121M may, for example, include, but not limited to, silicon nitride, silicon oxide or aluminum oxide, but the invention is not limited thereto.

Figure 3D:
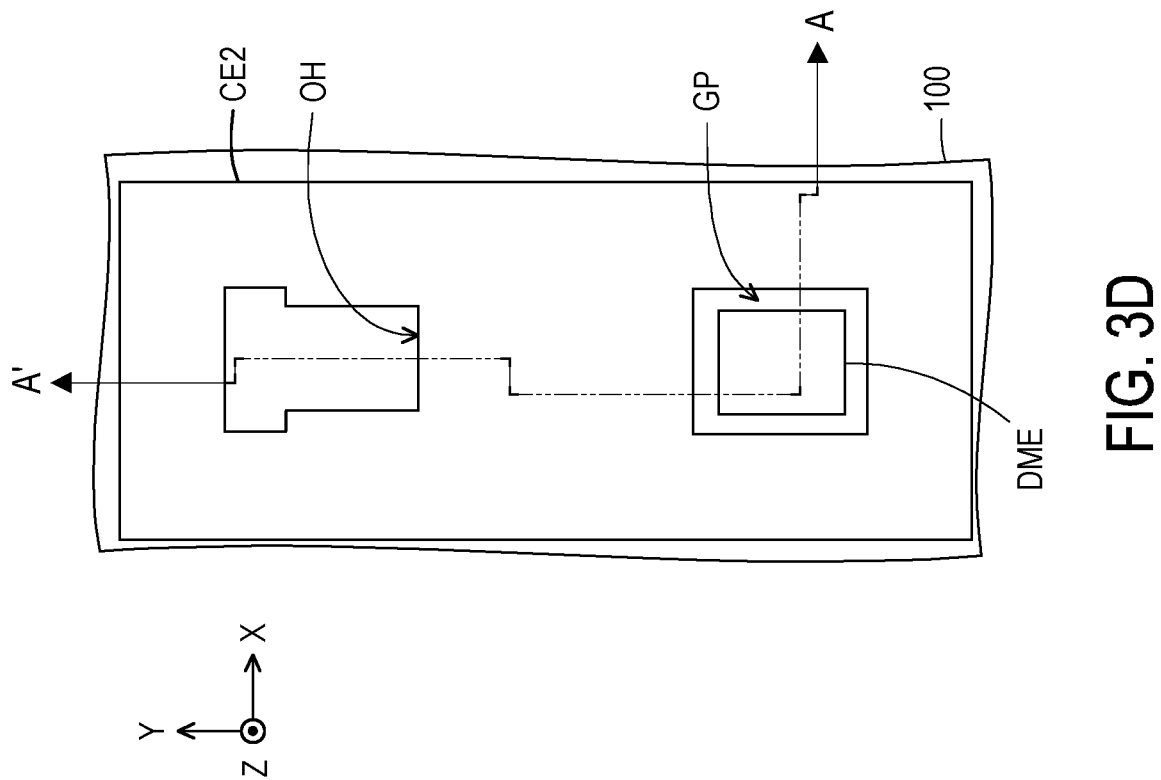
Figure 3C:
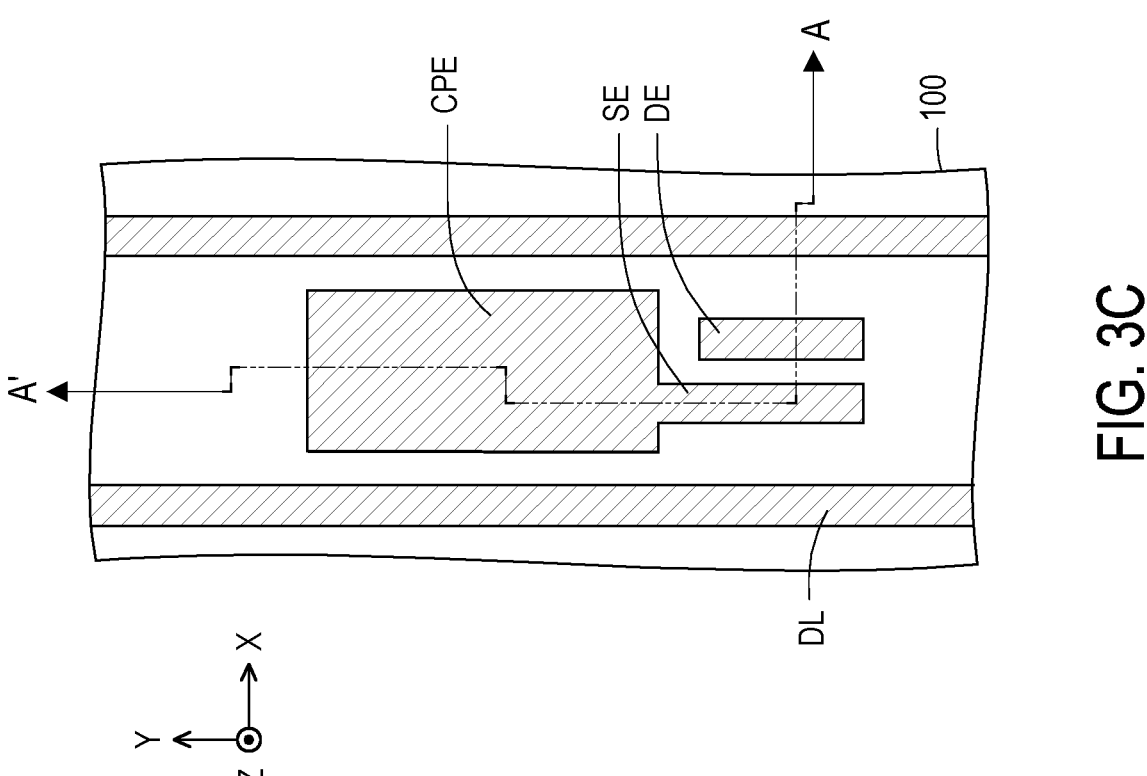
Figure 4A:
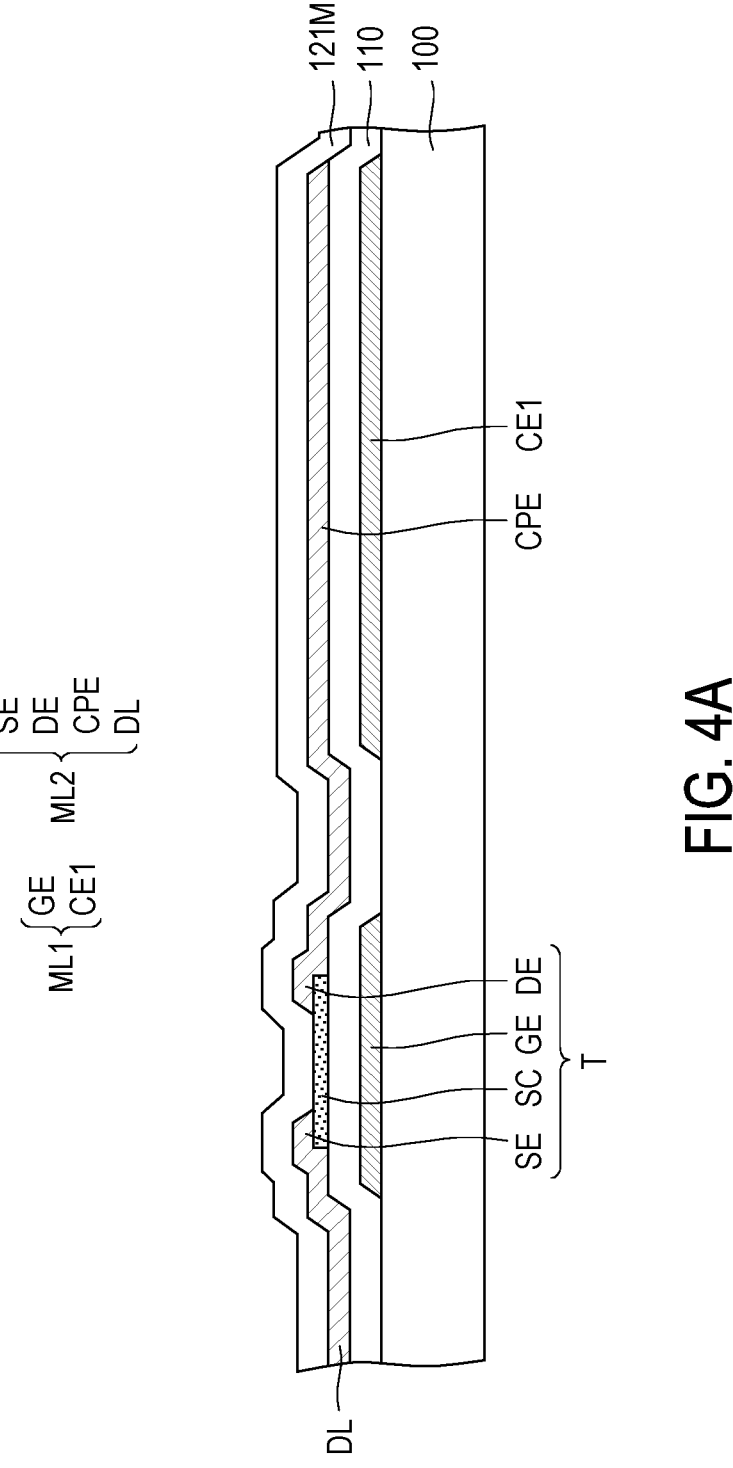
FIG. 4A to FIG. 4E are schematic cross-sectional views of a manufacturing process of the display panel of FIG. 1.
Figure 4B:
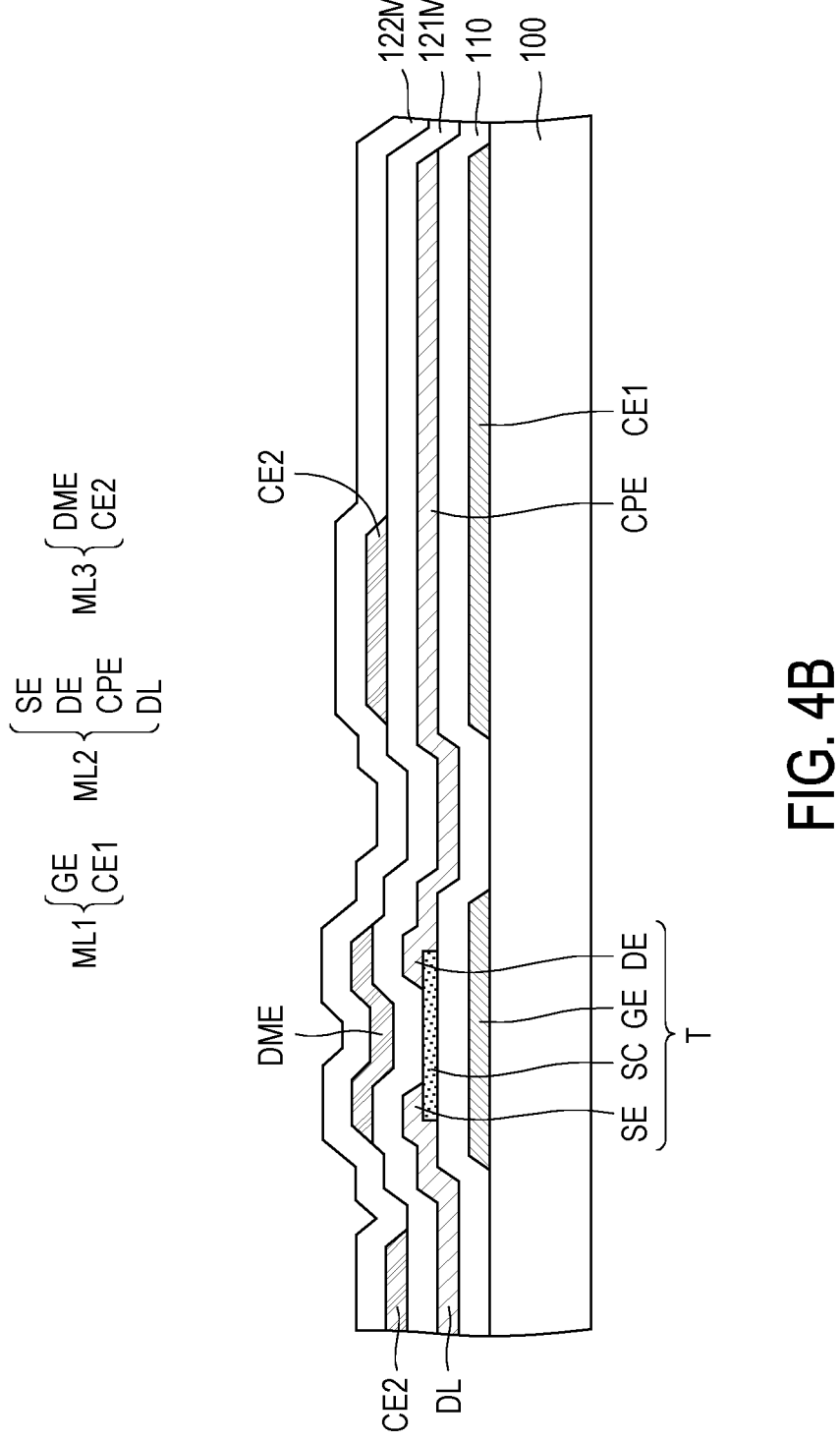
Figure 4C:
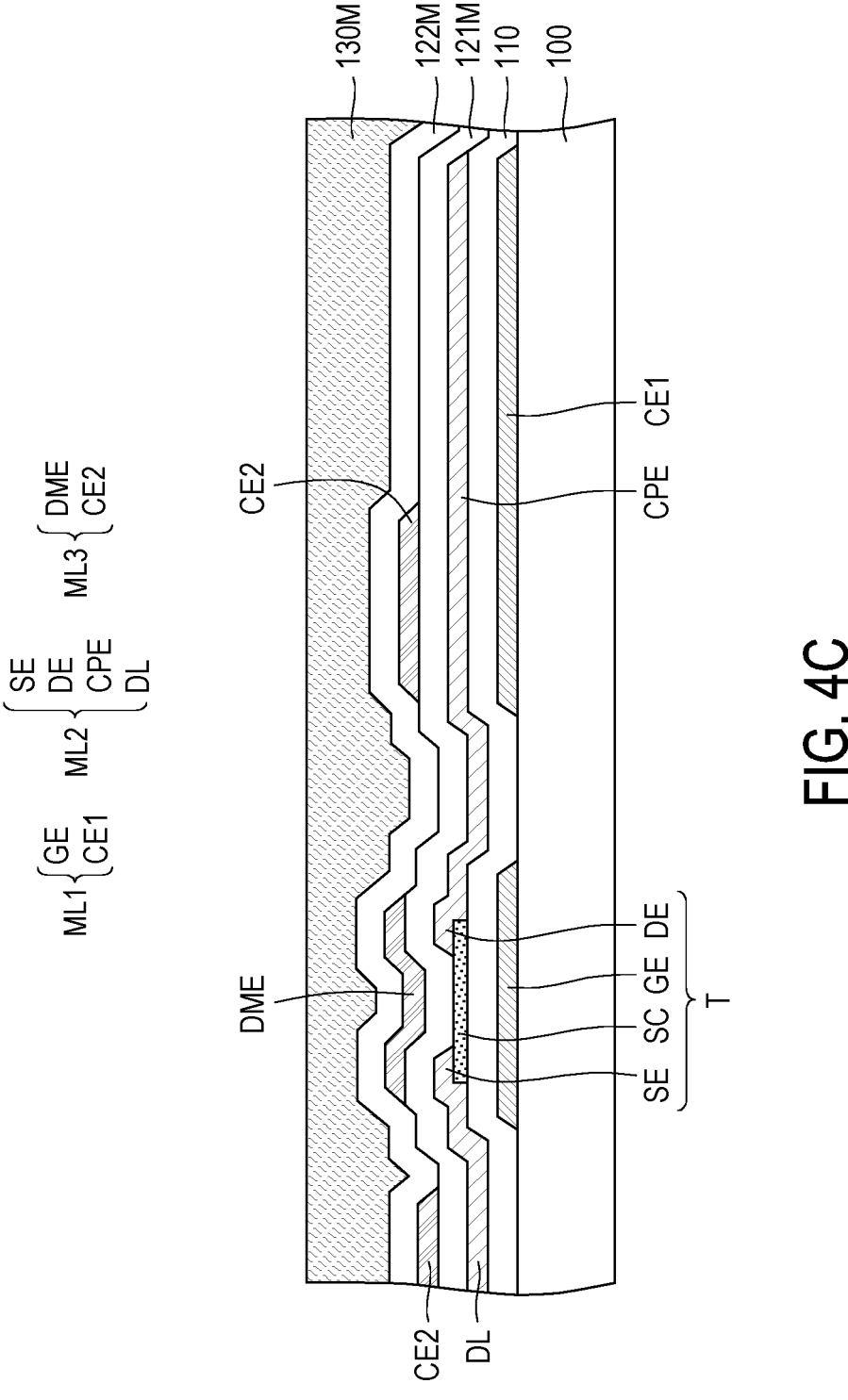

Referring to FIG. 3D and FIG. 4B, a third metal layer ML3 and a second passivation material layer 122M are sequentially formed on the first passivation material layer 121M. FIG. 3D is a schematic top view of the third metal layer ML3. The third metal layer ML3 may include the second common electrode CE2 and the dummy electrode DME, and the second common electrode CE2 and the dummy electrode DME have a gap GP there between and are electrically insulated from each other. The third metal layer ML3 has a hollow portion OH, and the hollow portion OH overlaps the transmissive region TA of FIG. 1. The second common electrode CE2 overlaps the capacitor electrode CPE and the data line DL of the second metal layer ML2 and the scan line SL of the first metal layer ML1. In the embodiment, the second common electrode CE2 overlaps and covers the data line DL and the scan line SL, so as to shield the interference of the signals of the data line DL and the scanning line SL to the pixel electrode PE. A material of the third metal layer ML3 may include metals (for example, molybdenum, aluminum, copper, nickel, materials, or other suitable materials, or a stacked layer of metal materials and other conductive materials.

Figures 3E, 3F:
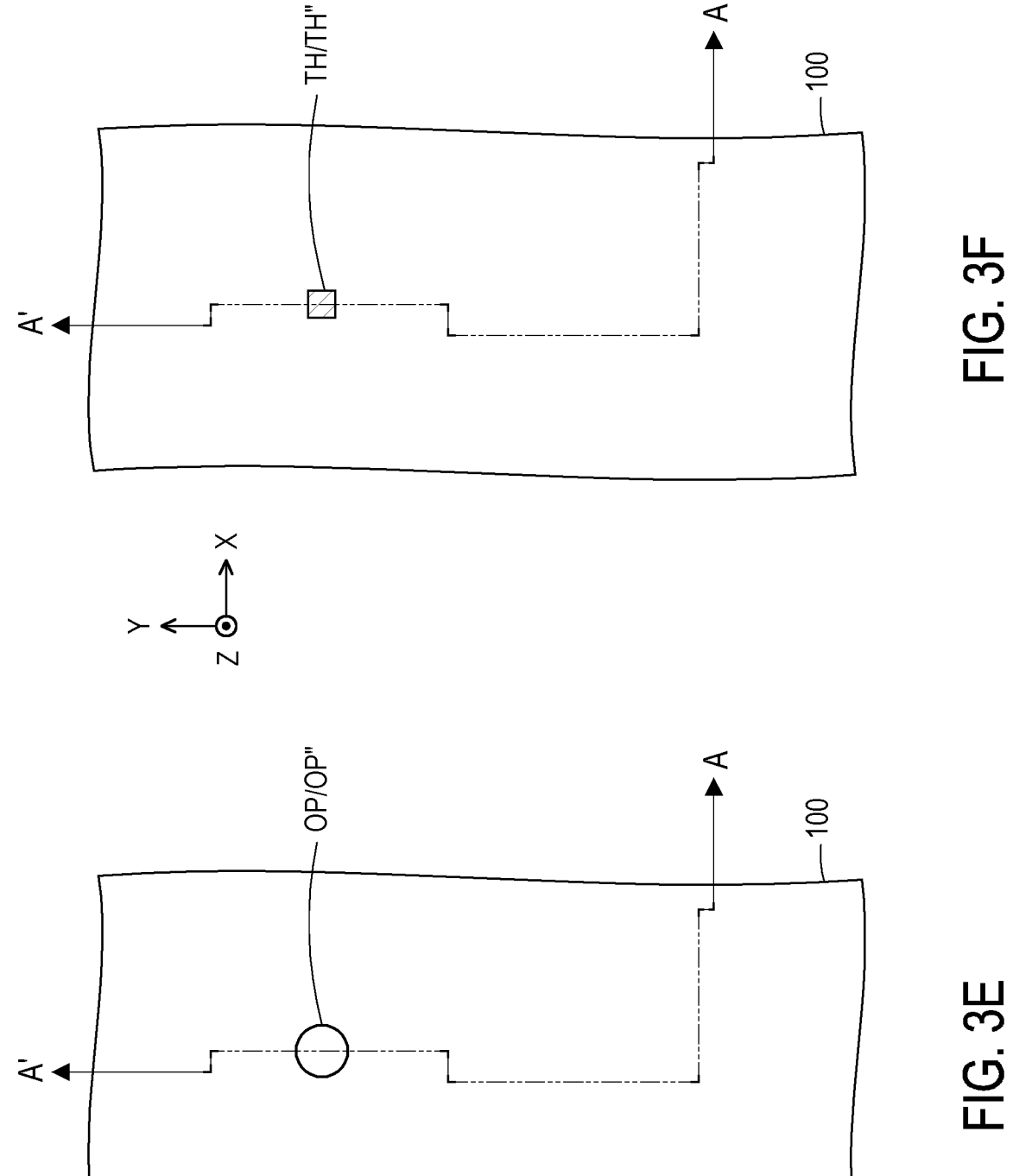

Then, the overcoat layer 130 is formed on the second passivation material layer 122M, as shown in FIG. 3E, FIG.

Figure 4D:
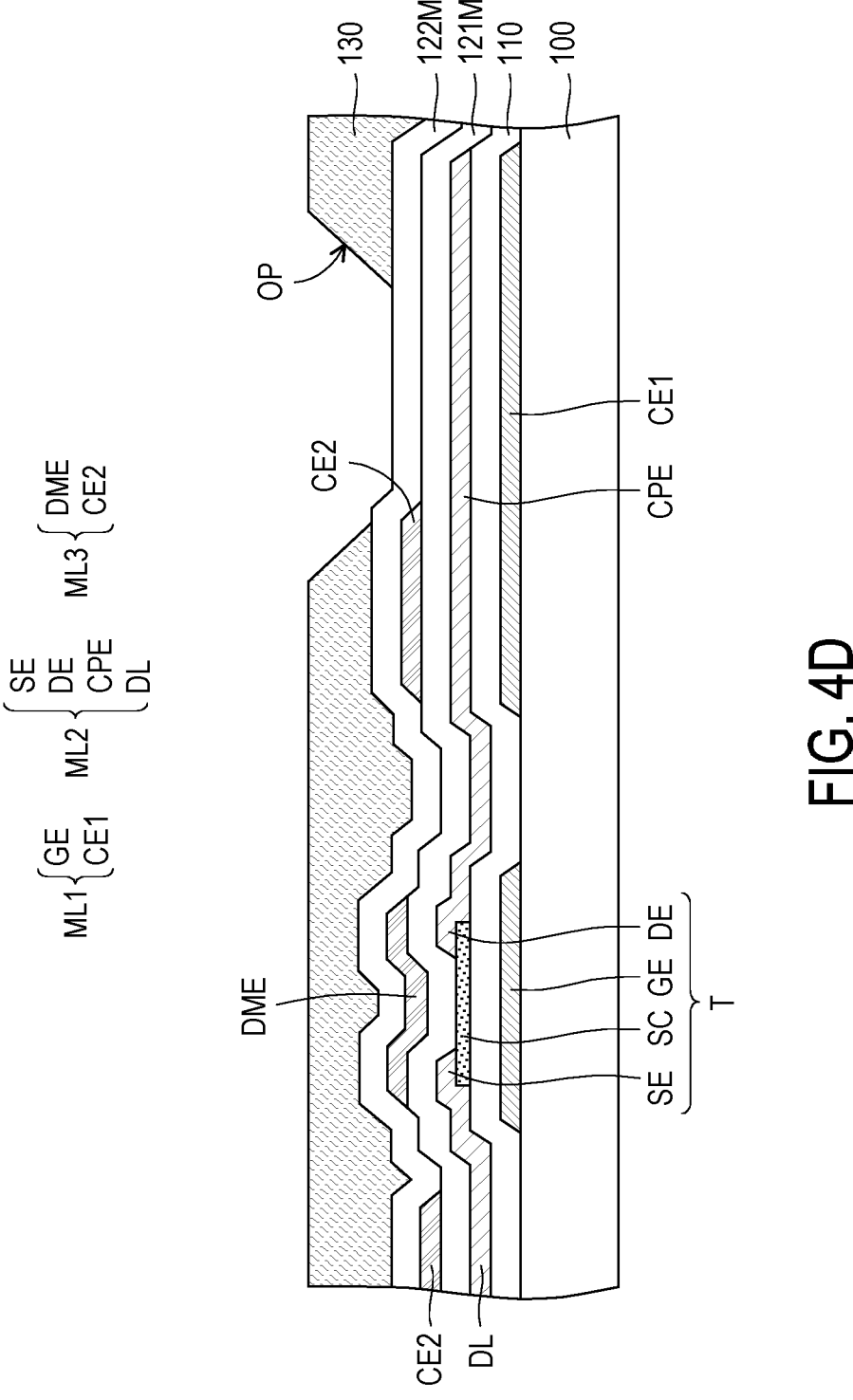
Figure 4E:
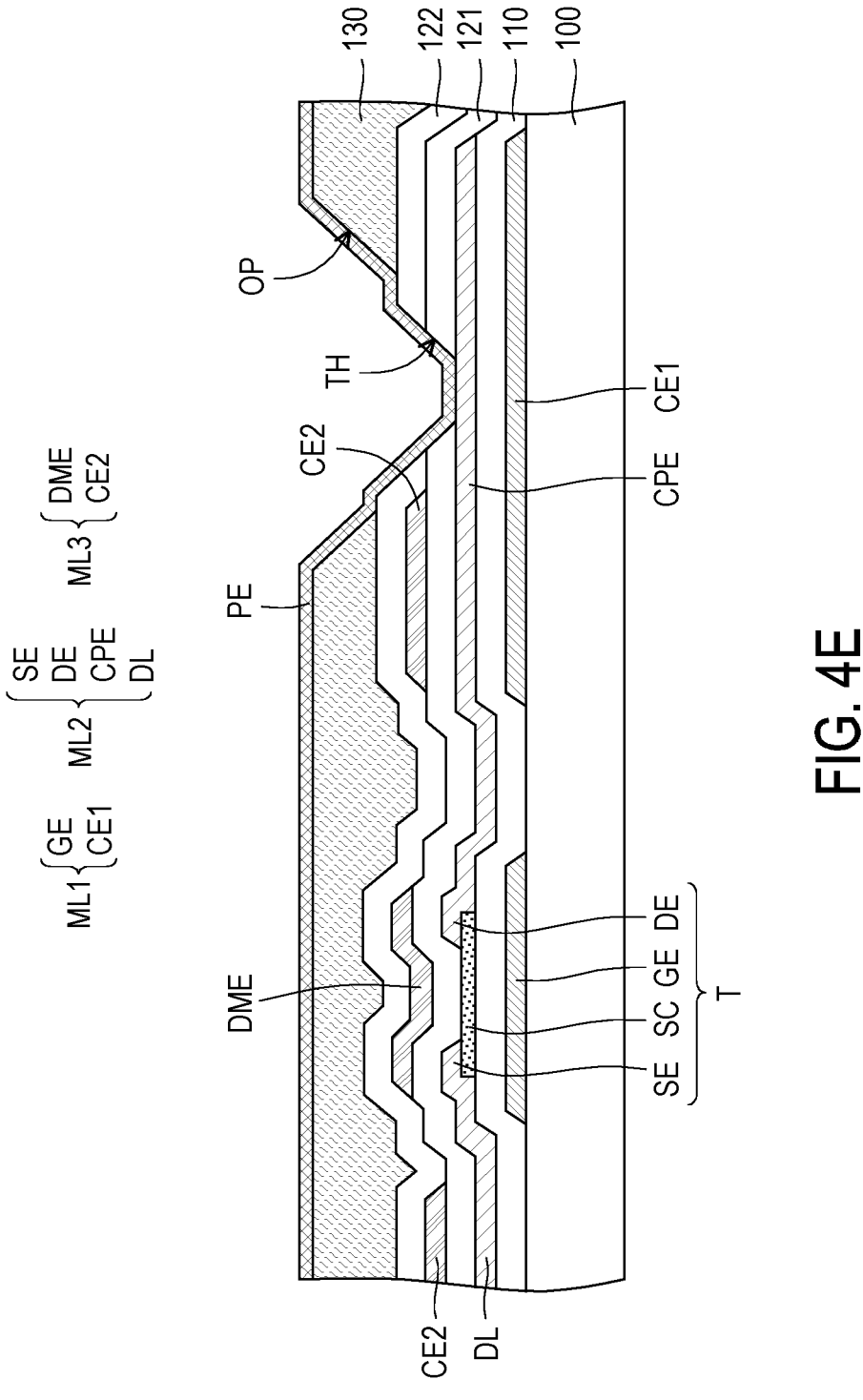

4C and FIG. 4D. FIG. 3E is a schematic top view of an opening OP of the overcoat layer 130. It should be noted that FIG. 3E is also a schematic top view of an opening OP" of the overcoat layer 130 of a display panel 10A according to a second embodiment of the invention (referring to the second embodiment described later), so that the opening of the overcoat layer 130 in FIG. 3E is marked as OP/OP". The overcoat layer 130 has the opening OP overlapping the capacitor electrode CPE, and the opening OP exposes a part of the second passivation material layer 122M. For example, in the embodiment, a material of the overcoat layer 130 may include a photosensitive material (for example, a photoresist material), and the step of forming the overcoat layer 130 includes forming an overcoat material layer 130M on the second passivation material layer 122M and performing an exposure process and a development process on the overcoat material layer 130M and removing a part of the overcoat material layer 130M to form the opening OP. Namely, the patterning process of the overcoat material layer 130M may be implemented without using an etching process, which helps to save the number of process steps.

In the embodiment, the overcoat layer 130 is, for example, an organic insulating layer, and a material thereof may include resin. For example, a material of the overcoat layer 130 may include polyester, polyolefin, polyacryl, polycarbonate, polyalkylene oxide, polyphenylene, polyether, polyketone, polyalcohol, polyaldehyde, or other suitable materials, or a combination of the materials. The second passivation material layer 122M is, for example, an inorganic insulating layer, and a material thereof may include, for example, silicon nitride, silicon oxide, or aluminum oxide, but the invention is not limited thereto. Therefore, by disposing the second passivation material layer 122M between the overcoat layer 130 and the third metal layer ML3, a problem of peeling off caused by direct contact of the overcoat layer 130 with the third metal layer ML3 may be avoided.

Figures 3G, 3H:
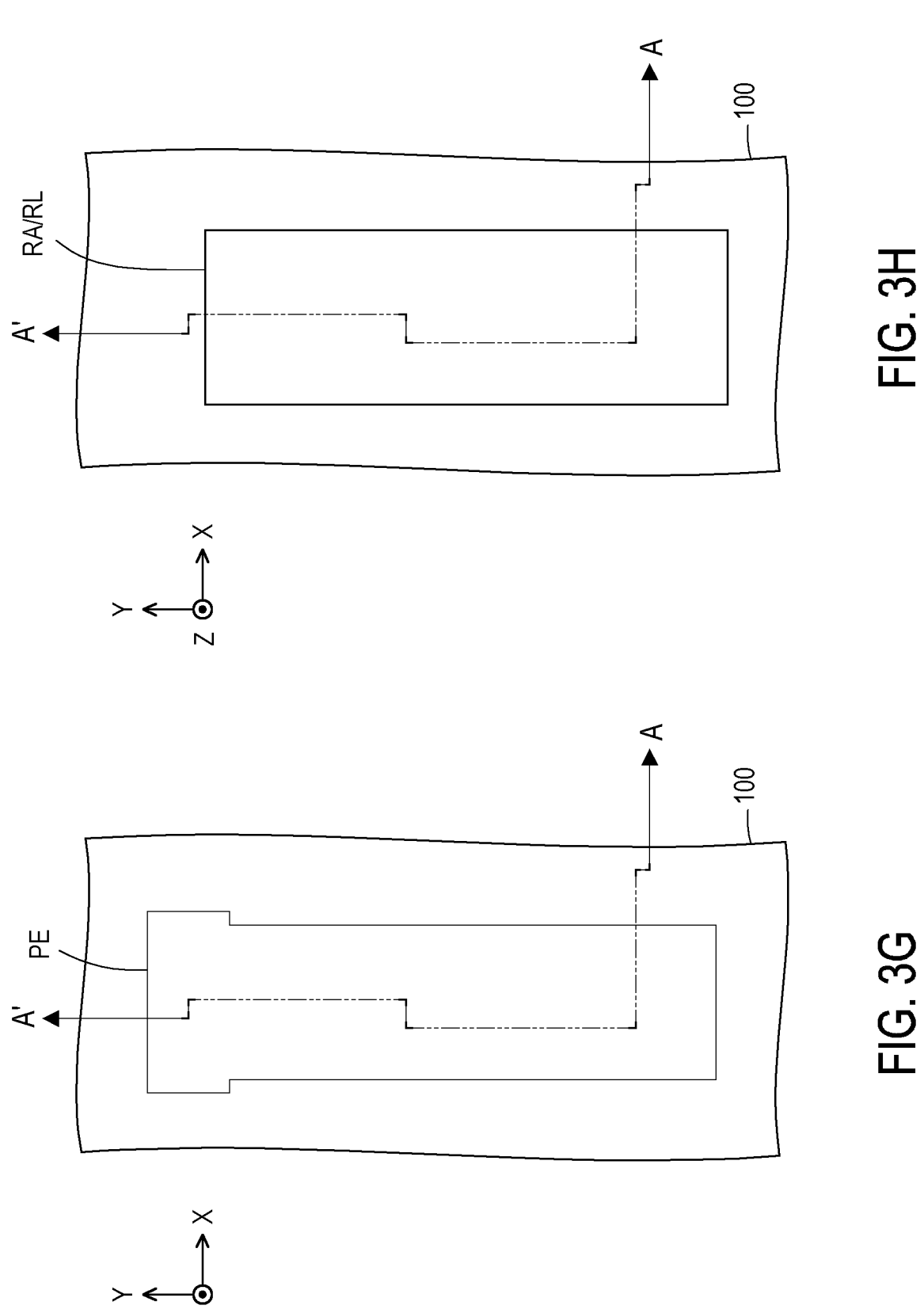

Referring to FIG. 3F, FIG. 3G, FIG. 4D and FIG. 4E, after the step of forming the overcoat layer 130 is completed, the first passivation material layer 121M and the second passivation material layer 122M are etched to form the first passivation layer 121 and the second passivation layer 122 with a contact hole TH. FIG. 3F is a schematic top view of the contact hole TH of the first passivation layer 121 and the second passivation layer 122, and FIG. 3G is a top schematic view of the pixel electrode PE. It should be noted that FIG. 3F is also a schematic top view of a contact hole TH" of the first passivation layer 121 and the second passivation layer 122 of the display panel 10A according to the second embodiment of the invention (referring to the second embodiment described later), so that the contact hole of the first passivation layer 121 and the second passivation layer 122 in FIG. 3F is indicated as TH/TH". For example, the step of etching the first passivation material layer 121M and the second passivation material layer 122M to form the contact hole TH is performed in a same lithography and etching process, so that in addition to saving the number of process steps, an amount of photo masks used to manufacture the display panel 10 may also be reduced. In the embodiment, since the overcoat layer 130 is made of a photosensitive material (for example, a photoresist material), in order to avoid the etching of the first passivation material layer 121M and the second passivation material layer 122M being blocked by the overcoat layer 130 during the etching process, a size of the contact hole TH is preferably is smaller than a size of the opening OP of the overcoat layer 130, and the contact hole TH is completely located in the opening OP in a top view direction (i.e., a size of a projection of the contact hole TH on the substrate 100 is smaller than a size of a projection of the opening OP of the overcoat layer 130 on the substrate 100, and the projection of the contact hole TH on the substrate 100 is completely located in the projection of the opening OP on the substrate 100), but the invention is not limited thereto.

In the embodiment, the overcoat layer 130 may also be referred to as a planarization layer to reduce an unevenness of an upper surface of the second passivation layer 122, i.e., an unevenness of an upper surface of the overcoat layer 130 is smaller than that of the second passivation layer 122 (i.e., a flatness of the upper surface of the overcoat layer 130 is greater than a flatness of the upper surface of the second passivation layer 122). For example, the overcoat layer 130 may be an organic material and is formed on the second passivation layer 122 by means of coating (for example, spin coating or slit coating), but the invention is not limited thereto. A thickness of the overcoat layer 130 in the direction Z is greater than a thickness of the second passivation layer 122 in the direction Z. In addition, in the embodiment, the thickness of the overcoat layer 130 in the direction Z is also larger than a thickness of any one of the first passivation layer 121 and the insulating layer 110 in the direction Z. For example, the thickness of the overcoat layer 130 may range from 1 μm to 5 μm, but the invention is not limited thereto.

After the step of forming the contact hole TH of the first passivation layer 121 and the second passivation layer 122 is completed, the pixel electrode PE is formed on the overcoat layer 130. The pixel electrode PE extends into the opening OP of the overcoat layer 130 and is electrically connected with the capacitor electrode CPE through the contact hole TH. In the embodiment, the pixel electrode PE is, for example, a light-transmissive electrode, and a material of the light-transmissive electrode may include a transparent conductive material. For example, the transparent conductive material may include metal oxides (for example, indium tin oxide, indium zinc oxide, aluminum tin oxide, aluminum zinc oxide, or other suitable oxides, or a stacked layer of at least two of the above oxides), but the invention is not limited thereto. The pixel electrode PE overlaps the reflective region RA and the transmissive region TA in FIG. 1.

Referring to FIG. 3H and FIG. 2, in the embodiment, after the step of forming the pixel electrode PE is completed, the reflective layer RL may be further formed on the pixel electrode PE, as shown in FIG. 2. FIG. 3H is a schematic top view of the reflective layer RL. The reflective layer RL directly covers a part of the pixel electrode PE, and forms an electrical connection therewith. A material of the reflective layer RL may include a metal material with high reflectivity or other suitable materials. For example, the metal material may include silver, aluminum, molybdenum, or other suitable metal, or a stacked layer of at least two of the above metal, but the invention is not limited thereto. The reflective layer RL overlaps the reflective region RA of FIG. 1 and does not overlap the transmissive region TA of FIG. 1. So far, the fabrication of the pixel array substrate is completed. Then, an assembly process is performed on the pixel array substrate and the substrate 200, where the display medium layer 300 is disposed between the pixel array substrate and the substrate 200. Thus, the fabrication of the display panel 10 of the embodiment is completed.

In addition, in some embodiments of the reflective display panel without the transmissive region TA, the pixel electrode PE may also be a reflective electrode, and a material of the reflective electrode may include metals, alloys, nitrides of metal materials, oxides of metal materials, oxynitrides of metal materials, or other suitable materials, or a stacked layer of the metal material and other conductive materials, so that there is no need to additionally form the reflective layer RL on the pixel electrode PE.

Hereinafter, other embodiments will be provided to describe the disclosure in detail, where the same components will be indicated with the same symbols, and the description of the same technical contents will be omitted. For the omitted parts, please refer to the aforementioned embodiments, which will not be repeated below.

Figure 5:
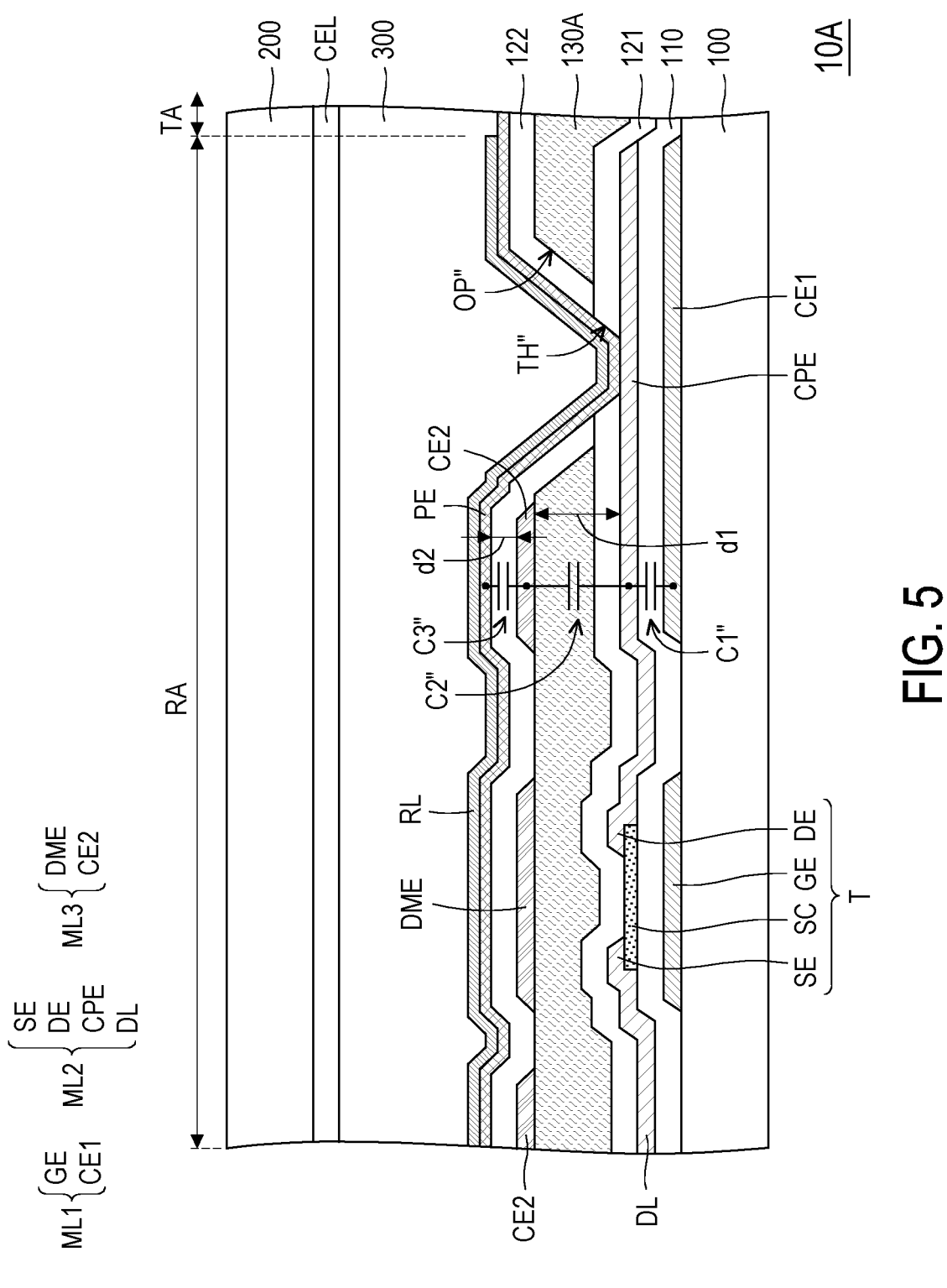
FIG. 5 is a schematic cross-sectional view of a display panel according to a second embodiment of the invention.
Figure 6C:
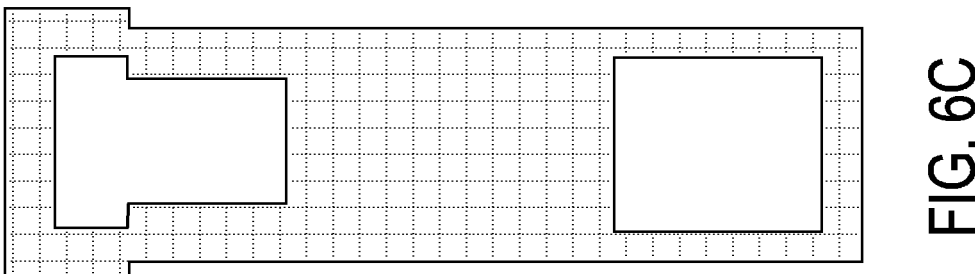
FIG. 6C is a schematic top view of an overlapping area between the second common electrode and the pixel electrode of FIG. 1.
Figure 6B:
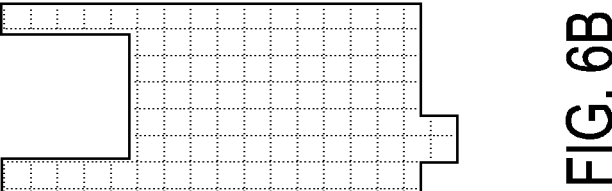
FIG. 6B is a schematic top view of an overlapping area between the capacitor electrode and a second common electrode of FIG. 1.
Figure 6A:
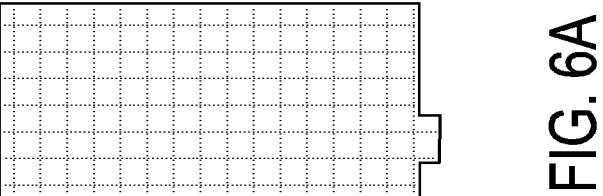
FIG. 6A is a schematic top view of an overlapping area between a first common electrode and a capacitor electrode of FIG. 1.

FIG. 5 is a schematic cross-sectional view of a display panel according to a second embodiment of the invention. FIG. 6A is a schematic top view of an overlapping area between the first common electrode and the capacitor electrode of FIG. 1 and FIG. 5. FIG. 6B is a schematic top view of an overlapping area between the capacitor electrode and the second common electrode of FIG. 1. FIG. 6C is a schematic top view of an overlapping area between the second common electrode and the pixel electrode of FIG. 1. FIG. 7A to FIG. 7E are schematic cross-sectional views illustrating a manufacturing process of the display panel of FIG.

Referring to FIG. 2 and FIG. 5 at the same time, regarding the display panel 10 of the aforementioned embodiment, since the thickness of the first passivation layer 121 (i.e., the thickness of the first passivation layer 121 in the direction Z) between the third metal layer ML3 and the second metal layer ML2 is thinner, a capacitive coupling effect between the second common electrode CE2 and the data line DL may be more significant, and a waveform of a potential signal transmitted on the data line DL is easily affected and changed by the above capacitive coupling effect, which causes a problem of insufficient charge and discharge of the pixel structure PX. In order to further mitigate this problem, in the display panel 10A of the embodiment, a stacking sequence of the third metal layer ML3, the second passivation layer 122 and an overcoat layer 130A is adjusted to sequentially dispose the overcoat layer 130A, the third metal layer ML3 and the second passivation layer 122 (referring to FIG. 5, the overcoat layer 130A is disposed below the third metal layer ML3, and the second passivation layer 122 is disposed above the third metal layer ML3). More specifically, in the second embodiment, the overcoat layer 130A of the display panel 10A is disposed between the active device T and the third metal layer ML3 (i.e., the overcoat layer 130A of the display panel 10A is disposed between the second metal ML2 and the third metal layer ML3), and the second passivation layer 122 is disposed on the overcoat layer 130A and covers the third metal layer ML3. Therefore, the first passivation layer 121 and the overcoat layer 130A are disposed between the third metal layer ML3 and the second metal layer ML2, and the capacitive coupling effect between the second common electrode CE2 and the data line DL is reduced in the second embodiment since a distance between the data line DL and the second common electrode CE2 is increased.

Since the film structures of the first metal layer ML1, the second metal layer ML2, the third metal layer ML3, the pixel electrode PE and the reflective layer RL and the overlapping relationship in the top view direction (for example, the direction Z) of the second embodiment are all the same as that of the display panel 10 of FIG. 2, the top-view structure of the display panel of the second embodiment may refer to that of the display panel 10 of FIG. 1. Materials of the first metal layer ML1, the second metal layer ML2, the third metal layer ML3, the pixel electrode PE, the reflective layer RL, the insulating layer 110, the first passivation layer 121 and the second passivation layer 122 of the second embodiment may refer to that of the first embodiment, a material of the overcoat layer 130A of the second embodiment may refer to that of the overcoat layer 130 of the first embodiment, and details thereof are not repeated. In addition, the schematic top views of the patterns of the first metal layer ML1, the semiconductor pattern SC, the second metal layer ML2, the third metal layer ML3, the opening OP″ of the overcoat layer 130A, the contact hole TH″ of the first passivation layer 121 and the second passivation layer 122, the pixel electrode PE and the reflective layer RL of the display panel 10A of the second embodiment may respectively refer to FIG. 3A to FIG. 3H. Similar to FIG. 2, the first common electrode CE1 is disposed between the capacitor electrode CPE and the substrate 100 and overlaps the capacitor electrode CPE along the direction Z. The second common electrode CE2 is disposed between the capacitor electrode CPE and the pixel electrode PE, and overlaps the pixel electrode PE and the capacitor electrode CPE along the direction Z. For example, the first common electrode CE1 may be electrically coupled to the capacitor electrode CPE and form a first storage capacitor C1″ (i.e., the first storage capacitor C1″ is formed by the first common electrode CE1, the capacitor electrode CPE, and at least one insulating film layer located between the above two electrodes). The capacitor electrode CPE may be electrically coupled to the second common electrode CE2 and form a second storage capacitor C2″ (i.e., the second storage capacitor C2″ is formed by the capacitor electrode CPE, the second common electrode CE2 and at least one insulating film layer located between the above two electrodes). The second common electrode CE2 may be electrically coupled to the pixel electrode PE and form a third storage capacitor C3″ (i.e., the third storage capacitor C3″ is formed by the second common electrode CE2, the pixel electrode PE and at least one insulating film layer located between the above two electrodes). More specifically, a storage capacitor of the pixel structure PX may be formed by connecting the first storage capacitor C1″, the second storage capacitor C2″, and the third storage capacitor C3″ in parallel. For example, the first storage capacitor C1″ is formed by the first common electrode CE1, the capacitor electrode CPE, and the insulating layer 110 located between the first common electrode CE1 and the capacitor electrode CPE. The second storage capacitor C2″ is formed by the capacitor electrode CPE, the second common electrode CE2, and the first passivation layer 121 and the overcoat layer 130A located between the capacitor electrode CPE and the second common electrode CE2. The third storage capacitor C3″ is formed by the second common electrode CE2, the pixel electrode PE, and the second passivation layer 122 located between the second common electrode CE2 and the pixel electrode PE.

In addition, the display panel 10A may further include the common electrode layer CEL disposed on a surface of the substrate 200 facing the display medium layer 300, i.e., the common electrode layer CEL is located between the substrate 200 and the display medium layer 300. For example, in the embodiment of the transflective display panel, the common electrode layer CEL is located in the reflective region RA and the transmissive region TA; in the embodiment of the reflective display panel without the transmissive region TA, the common electrode layer CEL is located in the reflective region RA. The material of the common electrode layer CEL may include a transparent conductive material, and the transparent conductive material may include, for example, a metal oxide (for example, indium tin oxide, indium zinc oxide, aluminum tin oxide, aluminum zinc oxide, or other suitable oxides), or a stacked layer of at least two of the above oxides), but the invention is not limited thereto. For example, the display medium layer 300 is, for example, a liquid crystal layer, and an electric field formed between the pixel electrode PE and the common electrode layer CEL may control a direction of the liquid crystal molecules in the display medium layer 300 to display a corresponding image. In the embodiment, the common electrode layer CEL, the first common electrode CE1 and the second common electrode CE2 may receive a common potential, but the invention is not limited thereto.

In addition to reducing the capacitive coupling effect between the second common electrode CE2 and the data line DL, a total capacitance value of the storage capacitors of the pixel structure PX of the second embodiment is greater than that of the first embodiment, and will be described below. A following table 1 is a comparison table of the storage capacitors of the first embodiment and the second embodiment.

For example, in the display panel 10 of FIG. 2 (i.e., the display panel 10 of the first embodiment), a thickness of the insulating layer 110 between the first metal layer ML1 and the second metal layer ML2 (i.e., a film thickness of the insulating layer between the first common electrode and the capacitor electrode in table 1) is 4000 angstroms, and a thickness of the first passivation layer 121 between the second metal layer ML2 and the third metal layer ML3 (i.e., a film thickness of the insulating film layer between capacitor electrode and the second common electrode in table 1) is 5000 angstroms, and a total thickness of the second passivation layer 122 and the overcoat layer 130 between the third metal layer ML3 and the pixel electrode PE (i.e. a film thickness of the insulating film layer between the second common electrode and the pixel electrode in table 1) is 25500 angstroms. The first common electrode CE1 is overlapped with the capacitor electrode CPE along the direction Z, and an overlapping area between the first common electrode CE1 and the capacitor electrode CPE (as shown in FIG. 6A) is 937.66 square micrometers. The capacitor electrode CPE is overlapped with the second common electrode CE2 along the direction Z, and an overlapping area between the capacitor electrode CPE and the second common electrode CE2 (as shown in FIG. 6B) is 741.66 square micrometers. The second common electrode CE2 is overlapped with the pixel electrode PE along the direction Z, and an overlapping area between the second common electrode CE2 and the pixel electrode PE (as shown in FIG. 6C) is 1518.96 square micrometers, so that a capacitance value of the first storage capacitor C1 is 114.04 femtofarads (fF), a capacitance value of the second storage capacitor C2 is 90.49 fF, a capacitance value of the third storage capacitor C3 is 36.34 fF, and a total capacitance value of the storage capacitors of the pixel structure PX is 240.87 fF.

In the display panel 10A of the embodiment, a thickness of the insulating layer 110 between the first metal layer ML1 and the second metal layer ML2 (i.e., a film thickness of the insulating layer between the first common electrode and the capacitor electrode in table 1) is 4000 angstroms, a total thickness d1 of the first passivation layer 121 and the overcoat layer 130A between the second metal layer ML2 and the third metal layer ML3 (i.e. a film thickness of the insulating film layer between the capacitor electrode and the second common electrode in table 1) is 27000 angstroms, and a thickness d2 of the second passivation layer 122 between the third metal layer ML3 and the pixel electrode PE (i.e. a film thickness of the insulating film layer between the second common electrode and the pixel electrode in table 1) is 4000 angstroms. In the second embodiment, the first passivation layer 121 and the overcoat layer 130A are disposed between the third metal layer ML3 and the second metal layer ML2, the second passivation layer 122 is disposed between the third metal layer ML3 and the pixel electrode PE, and the total thickness d1 of the first passivation layer 121 and the overcoat layer 130A is greater than the thickness d2 of the second passivation layer 122. Therefore, in the second embodiment, the capacitor electrode CPE and the second common electrode CE2 have a first distance (i.e. a total thickness d1 of the first passivation layer 121 and the overcoat layer 130A) therebetween in a stacking direction, pixel electrode PE in the embodiment are the same as that of the display panel 10 in FIG. 1. Therefore, in the embodiment, an overlapping area between the first common electrode CE1 and the capacitor electrode CPE, an overlapping area between the capacitor electrode CPE and the second common electrode CE2, and an overlapping area between the second common electrode CE2 and the pixel electrode PE are the same as that in the first embodiment. As shown in Table 1, a capacitance value of the first storage capacitor C1" of the embodiment is 114.04 fF, a capacitance value of the second storage capacitor C2" is 16.76 fF, a capacitance value of the third storage capacitor C3" is 231.66 fF, and a total capacitance value of the storage capacitors of the pixel structure PX is 362.46 fF.

TABLE 1

| First and second embodiments | | | First embodiment | Second embodiment | | First embodiment | Second embodiment |
|---|---|---|---|---|---|---|---|
| Overlapping area between the first common electrode and the capacitor electrode | 937.66 square μm | Film thickness of insulating film layer between the first common electrode and the capacitor electrode | 4000 angstroms | 4000 angstroms | First storage capacitor | 114.04 fF | 114.04 fF |
| Overlapping area between the capacitor electrode and the second common electrode | 741.66 square μm | Film thickness of insulating film layer between the capacitor electrode and the second common electrode | 5000 angstroms | 27000 angstroms | Second storage capacitor | 90.49 fF | 16.76 fF |
| Overlapping area between the second common electrode and the pixel electrode | 1518.96 square μm | Film thickness of insulating film layer between the second common electrode and the pixel electrode | 25500 angstroms | 4000 angstroms | Third storage capacitor | 36.34 fF | 231.66 fF |
| | | | | | Total capacitance value of storage capacitors | 240.87 fF | 362.46 fF | the second common electrode CE2 and the pixel electrode PE have a second distance (i.e. a thickness d2 of the second passivation layer 122) therebetween in the stacking direction, and the first distance is greater than the second distance, in which the capacitor electrode CPE, the second common electrode CE2 and the pixel electrode PE are disposed above an upper surface of the substrate 100, and the stacking direction is a direction perpendicular to the upper surface of the substrate 100 (i.e., the direction Z). A top-view structure and an overlapping relationship of the metal layers and the In the display panel 10A of the embodiment, since the overcoat layer 130A with a thicker thickness than the passivation layer is disposed between the second common electrode CE2 and the capacitor electrode CPE to effectively reduce the coupling effect between the second common electrode CE and the data line DL of the second metal layer ML2, a capacitance value of the second storage capacitor C2" will also be significantly reduced compared to the capacitance value of the second storage capacitor C2 of the display panel 10.

It should be noted that although the capacitance value of the second storage capacitor C2" (for example, 16.76 fF) of the display panel 10A in the second embodiment is greatly reduced compared to the capacitance value of the second storage capacitor C2 (for example, 90.49 fF) of the display panel 10 (for example, reduced by 73.73 fF), a capacitance value of the third storage capacitor C3" (for example, 231.66 fF) of the display panel 10A is greatly increased compared to the capacitance value of the third storage capacitor C3 (for example, 36.34 fF) of the display panel (for example, increased by 195.32 fF). Since the overlapping area between the second common electrode CE2 and the pixel electrode PE (for example, 1518.96 square micrometers) in the first and second embodiments is much larger than the overlapping area between the capacitor electrode CPE and the second common electrode CE2 (for example, 741.66 square micrometers), a reduced value (for example, 73.73 fF) of the capacitance value of the second storage capacitor C2" of the display panel 10A of the second embodiment compared to the capacitance value of the second storage capacitor C2 of the display panel 10 of the first embodiment is much smaller than an increased value (for example, 195.32 fF) of the capacitance value of the third storage capacitor C3" of the display panel 10A of the second embodiment compared to the capacitance value of the second storage capacitor C2 of the display panel 10 of the first embodiment. Therefore, compared with a total capacitance value (for example, 240.87 fF) of the storage capacitors of the display panel 10 of the first embodiment, disposition of the overcoat layer 130A between the second metal layer ML2 and the third metal layer ML3 may also significantly increase the total capacitance value (for example, 362.46 fF) of the storage capacitors of the display panel 10A of the second embodiment, which helps to improve operational electrical properties of the pixel structure.

A manufacturing method of the display panel 10A is exemplarily described below.

Referring to FIG. 3A-FIG. 3C and FIG. 7A, FIG. 3A is a schematic top view of the first metal layer ML1, FIG. 3B is a schematic top view of the semiconductor pattern SC, and FIG. 3C is a schematic top view of the second metal layer ML2. First, the first metal layer ML1 is formed on the substrate 100. In the embodiment, the first metal layer ML1 includes the scan line SL (as shown in FIG. 1), the gate GE and the first common electrode CE1. The material of the substrate 100 is, for example, glass, quartz, polymer, or other suitable plates. The material of the first metal layer ML1 may include metals (for example, molybdenum, aluminum, copper, nickel, materials, or other suitable materials, or a stacked layer of metal materials and other conductive materials.

The insulating layer 110 is formed on the first metal layer ML1. The insulating layer 110 is, for example, a gate insulating layer, and a material thereof may include silicon oxide, silicon nitride or other suitable dielectric materials. The semiconductor pattern SC and the second metal layer ML2 are formed on the insulating layer 110. Then, the first passivation material layer 121M is formed on the second metal layer ML2. The material of the first passivation material layer 121M may include, but not limited to, silicon nitride, silicon oxide or aluminum oxide, but the invention is not limited thereto.

In the embodiment, the second metal layer ML2 includes the data line DL (as shown in FIG. 1), the source SE, the drain DE and the capacitor electrode CPE. The capacitor electrode CPE overlaps the first common electrode CE1 of the first metal layer ML1. The semiconductor pattern SC may be used as a channel layer of the active device T, and the source SE and the drain DE are respectively electrically connected to two different regions of the semiconductor pattern SC. Here, the gate GE, the source SE, the drain DE and the semiconductor pattern SC may constitute the active device T. Since the active device T of the embodiment is the same as the active device T of the display panel 10 of the aforementioned embodiment, reference may be made to the relevant paragraphs of the aforementioned embodiment for detailed descriptions of the active device T, which will not be repeated here.

Figure 7A:
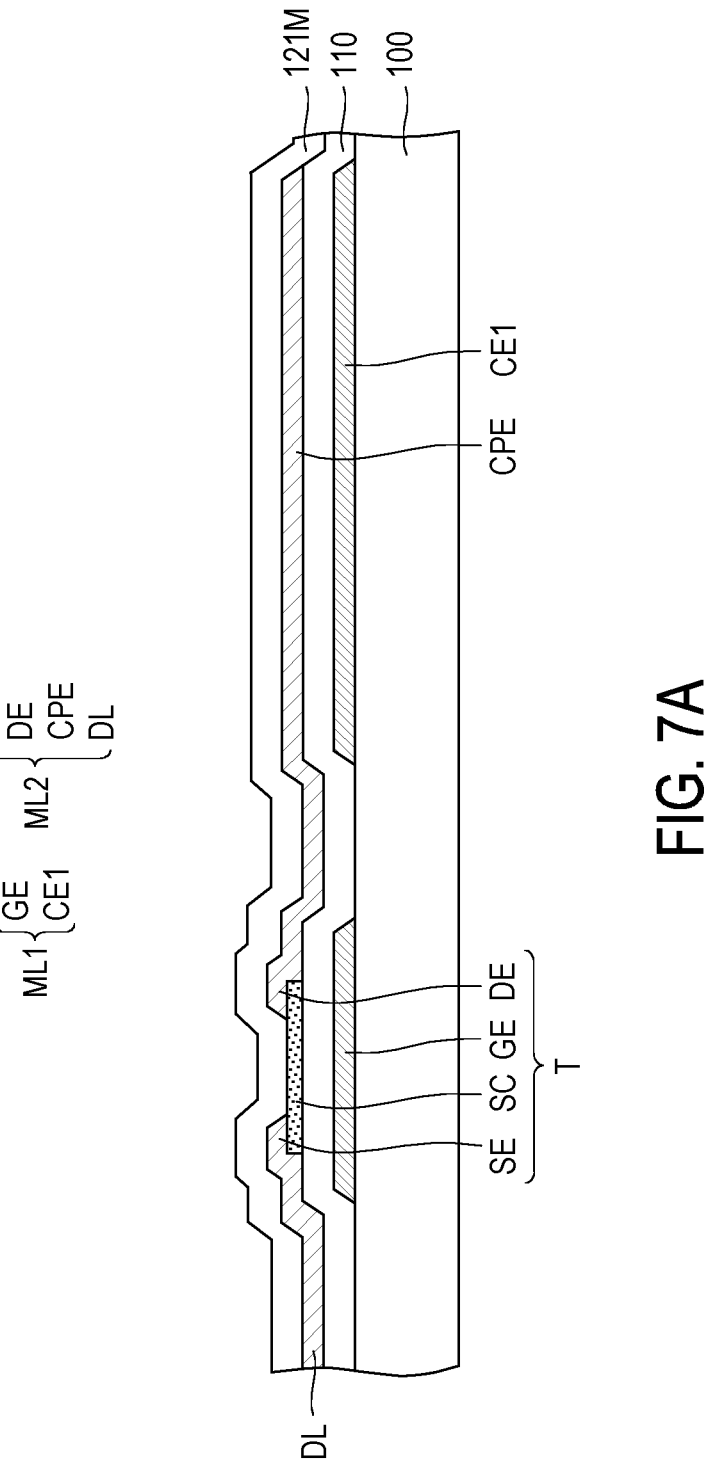
FIG. 7A to FIG. 7E are schematic cross-sectional views illustrating a manufacturing process of the display panel of FIG. 5.
Figure 7B:
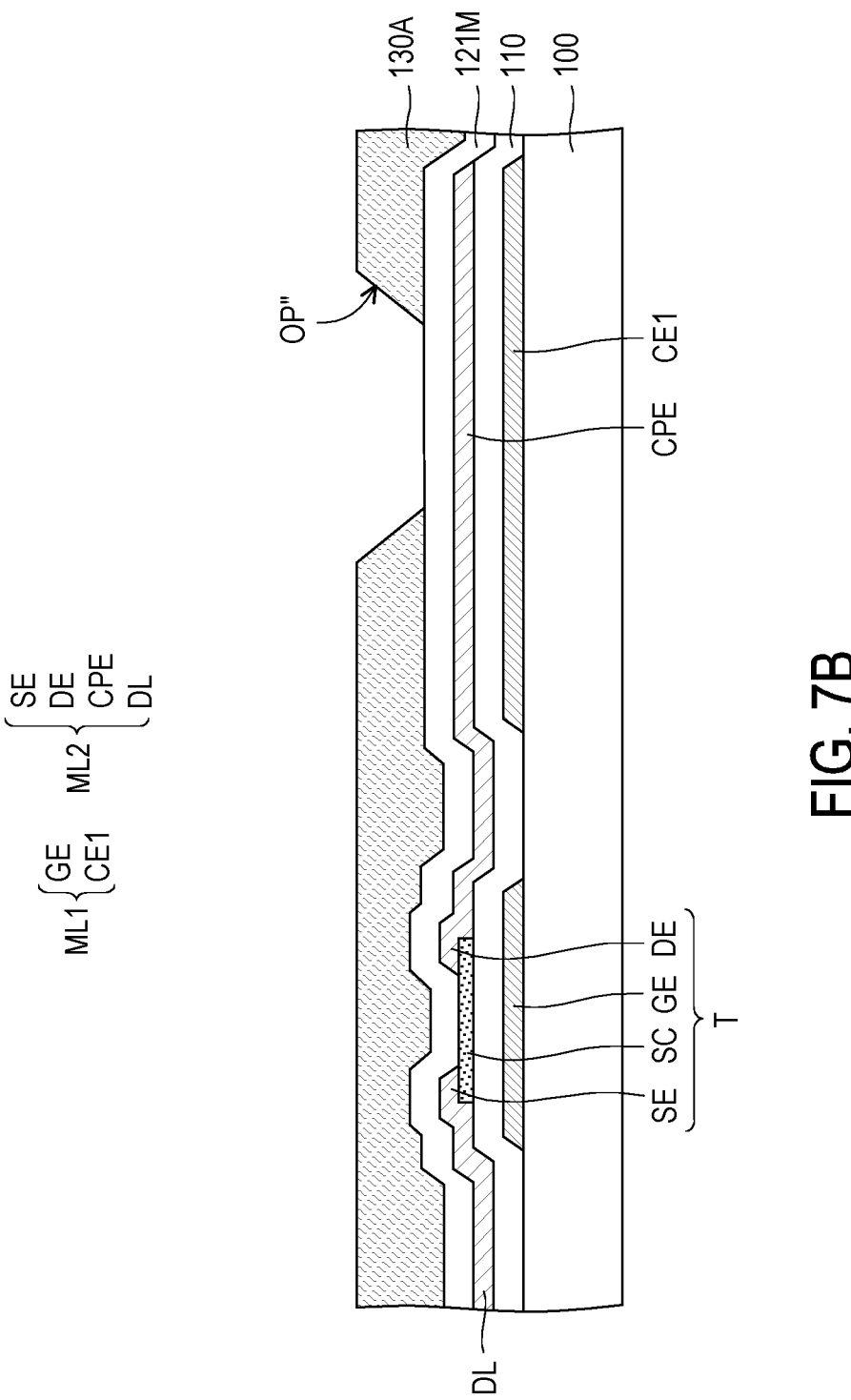

Referring to FIG. 3E and FIG. 7B, FIG. 3E is a schematic top view of the opening OP'' of the overcoat layer 130A. The overcoat layer 130A is formed on the first passivation material layer 121M. The overcoat layer 130A has the opening OP'' overlapping the capacitor electrode CPE, and the opening OP'' exposes a part of the first passivation material layer 121M. The formation steps of the overcoat layer 130A are similar to the formation steps of the overcoat layer 130 of the display panel 10 of the aforementioned embodiment. For example, in the embodiment, a material of the overcoat layer 130A may include a photosensitive material (for example, a photoresist material), and the step of forming the overcoat layer 130A includes forming an overcoat material layer on the first passivation material layer 121M and performing an exposure process and a development process on the overcoat material layer and removing a part of the overcoat material layer to form the opening OP''. Namely, the patterning process of the overcoat material layer may be completed without an etching process, which helps to save the number of process steps.

In the embodiment, the overcoat layer 130A is, for example, an organic insulating layer, and a material thereof may include resin. For example, a material of the overcoat layer 130A may include polyester, polyolefin, polyacryl, polycarbonate, polyalkylene oxide, polyphenylene, polyether, polyketone, polyalcohol, polyaldehyde, or other suitable materials, or a combination thereof. The first passivation material layer 121M is, for example, an inorganic insulating layer, and a material thereof may, for example, include silicon nitride, silicon oxide, or aluminum oxide, but the invention is not limited thereto. Therefore, by disposing the first passivation material layer 121M between the overcoat layer 130A and the second metal layer ML2, the problem of peeling off caused by direct contact of the overcoat layer 130A with the second metal layer ML2 may be avoided.

Figure 7C:
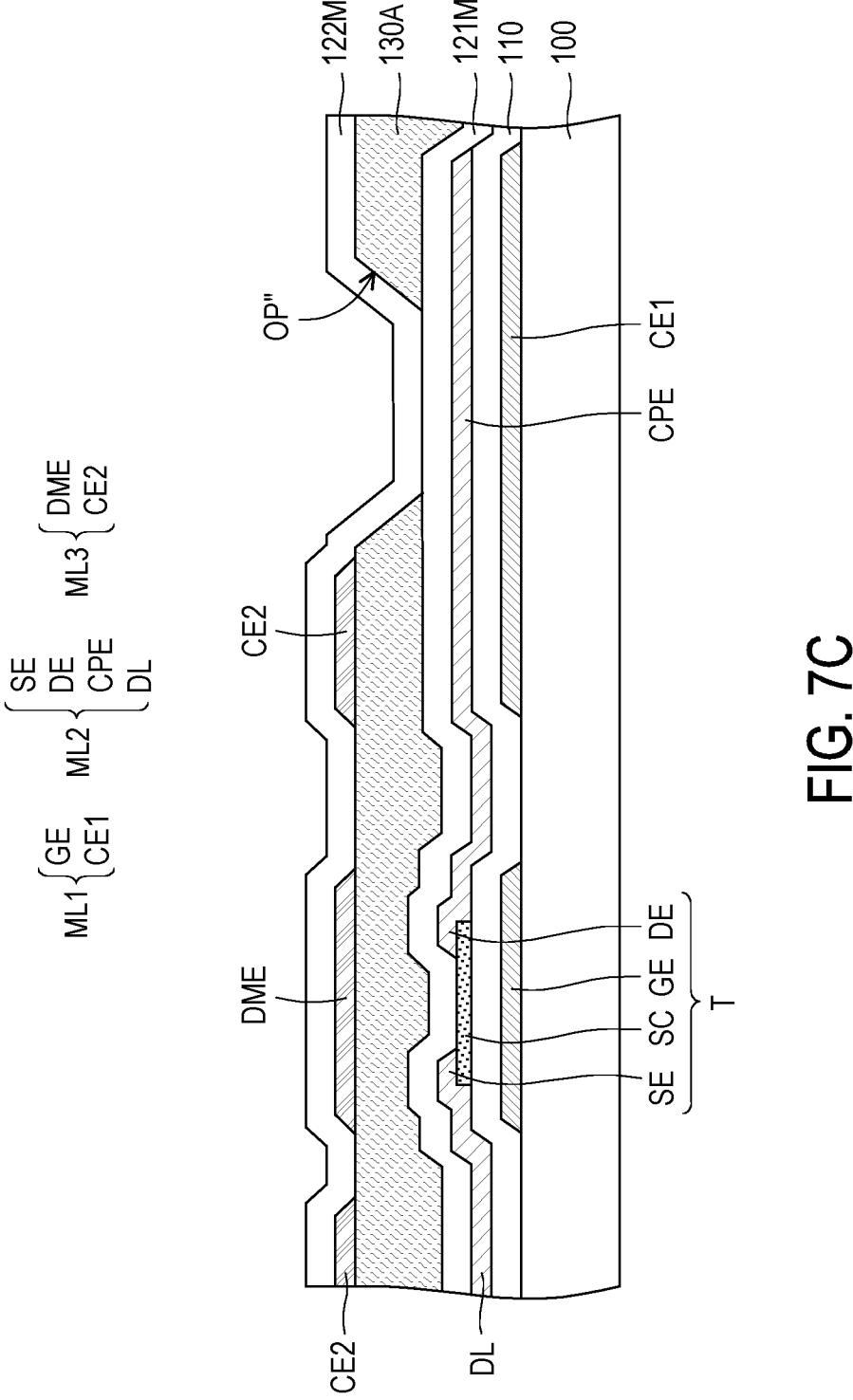

Referring to FIG. 3D, FIG. 3F, FIG. 7C and FIG. 7D, FIG. 3D is a schematic top view of the third metal layer ML3, and FIG. 3F is a schematic top view of the contact hole TH'' of the first passivation layer 121 and the second passivation layer 122. As shown in FIG. 7C, the third metal layer ML3 and the second passivation material layer 122M are sequentially formed on the overcoat layer 130A. The second passivation material layer 122M extends into the opening OP'' of the overcoat layer 130A and covers a part of the first passivation material layer 121M. The third metal layer ML3 may include the second common electrode CE2 and the dummy electrode DME. The second common electrode CE2 overlaps the capacitor electrode CPE and the data line DL of the second metal layer ML2. The dummy electrode DME overlaps the active device T. The material of the third metal layer ML3 may include metals (for example, molybdenum, aluminum, copper, nickel, chromium), alloys, nitrides of metal materials, oxides of metal materials, oxynitrides of metal materials, or other suitable materials, or a stacked layer of metal materials and other conductive materials.

Figure 7D:
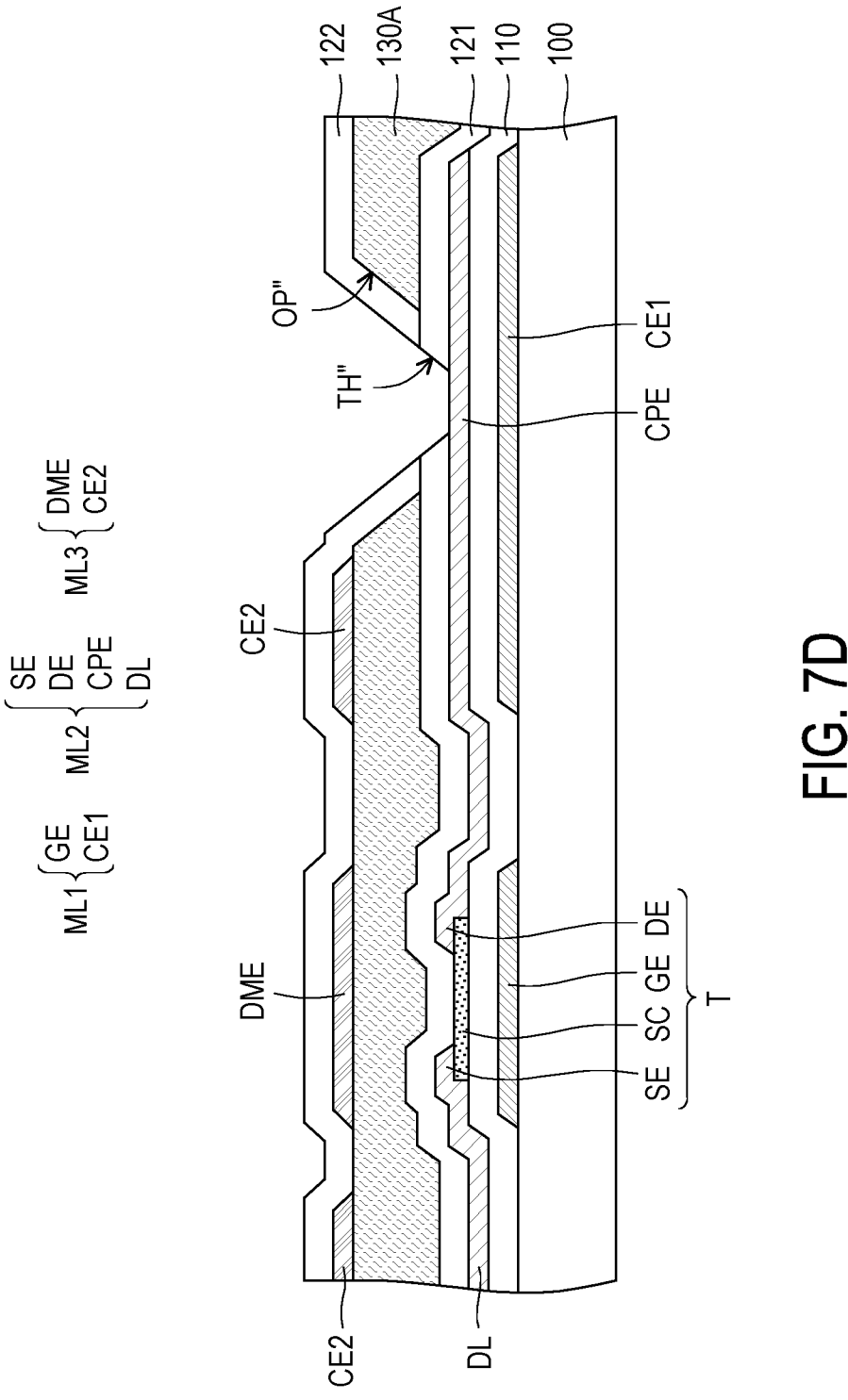

As shown in FIG. 7D, then, the first passivation material layer 121M and the second passivation material layer 122M are etched to form the first passivation layer 121 and the second passivation layer 122 having the contact hole TH", where the contact hole exposes a part of the surface of the capacitor electrode CPE. For example, the step of etching the first passivation material layer 121M and the second passivation material layer 122M to form the contact hole TH" is performed in a same lithography and etching process, so that in addition to saving the number of process steps, the number of used process masks is also reduced. In the embodiment, since the material of the overcoat layer 130A is a photosensitive material (for example, a photoresist material), in order to prevent the etching of the first passivation material layer 121M and the second passivation material layer 122M from being blocked by the overcoat layer 130A during the etching process, the size of the contact hole TH" is preferably smaller than the size of the opening OP" of the overcoat layer 130, and the contact hole TH" is completely located in the opening OP" in the top view direction (i.e., a size of a projection of the contact hole TH" on the first substrate 100 is smaller than a size of a projection of the opening OP" of the overcoat layer 130 on the first substrate 100, and the projection of the contact hole TH" on the first substrate 100 is completely located in the projection of the opening OP" on the first substrate 100), but the invention is not limited thereto.

In the embodiment, the overcoat layer 130 may also be referred to as a planarization layer to reduce an unevenness of the upper surface of the first passivation layer 121, i.e., an unevenness of the upper surface of the overcoat layer 130 is smaller than an unevenness of the upper surface of the first passivation layer 121 (i.e., a flatness of the upper surface of the overcoat layer 130 is greater than a flatness of the upper surface of the first passivation layer 121). For example, the overcoat layer 130 may be an organic material and is formed on the first passivation layer 121 by means of coating (for example, spin coating or slit coating), but the invention is not limited thereto. A thickness of the overcoat layer 130 in the direction Z is greater than a thickness of the first passivation layer 121 in the direction Z. In addition, in the embodiment, the thickness of the overcoat layer 130 in the direction Z is also larger than a thickness of any one of the second passivation layer 122 and the insulating layer 110 in the direction Z. For example, the thickness of the overcoat layer 130 may range from 1μm to 5 μm, but the invention is not limited thereto.

Figure 7E:
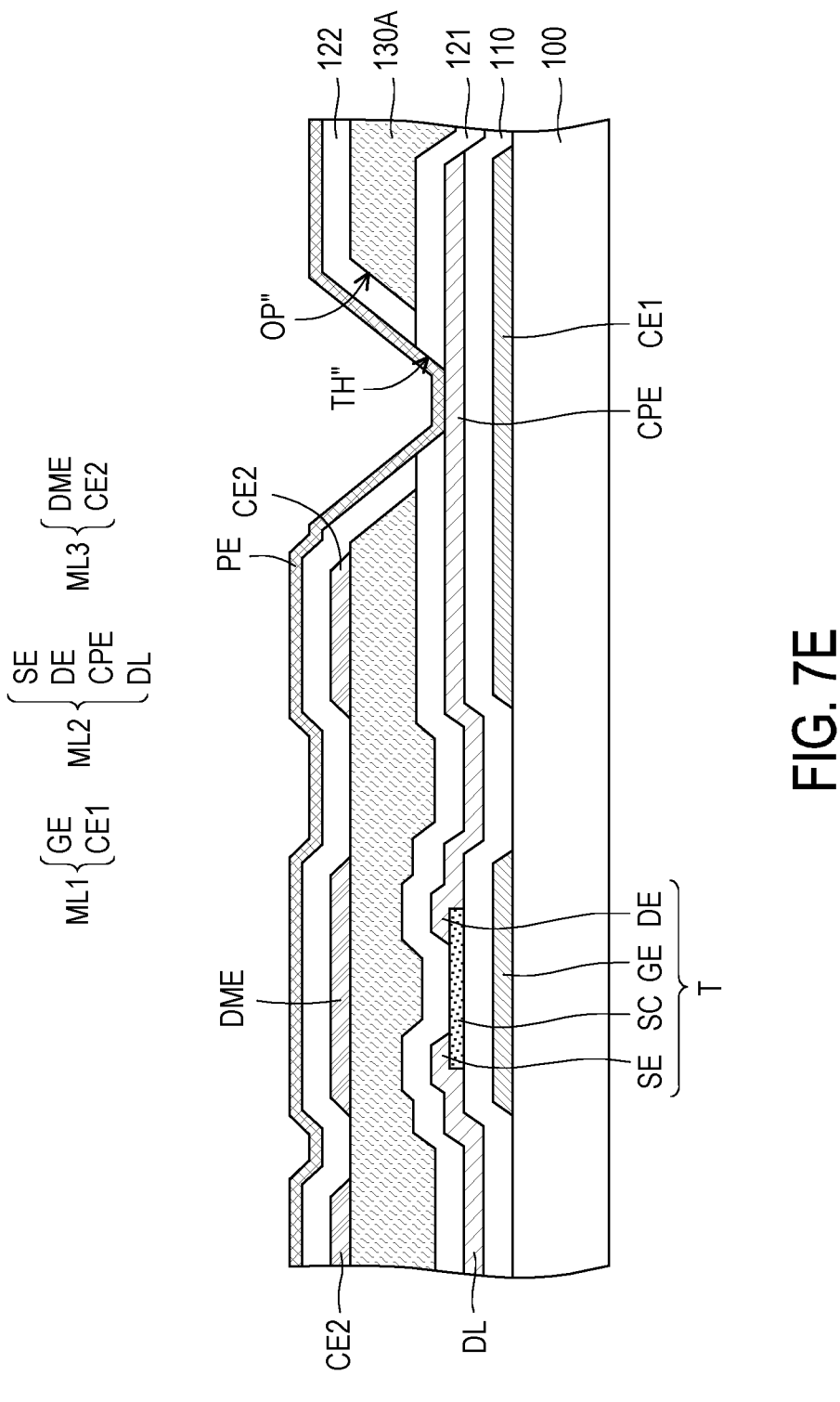

Referring to FIG. 3G and FIG. 7E, FIG. 3G is a schematic top view of the pixel electrode PE. After the step of forming the contact hole TH" of the first passivation layer 121 and the second passivation layer 122 is completed, the pixel electrode PE is formed on the second passivation layer 122. The pixel electrode PE extends into the opening OP" of the overcoat layer 130 and is electrically connected with the capacitor electrode CPE through the contact hole TH". In the embodiment, the pixel electrode PE is, for example, a light-transmissive electrode, and a material of the light-transmissive electrode may include a transparent conductive material. For example, the transparent conductive material may include metal oxides (for example, indium tin oxide, indium zinc oxide, aluminum tin oxide, aluminum zinc oxide, or other suitable oxides, or a stacked layer of at least two of the above oxides), but the invention is not limited thereto.

Referring to FIG. 3H and FIG. 5, FIG. 3H is a schematic top view of the reflective layer RL. In the embodiment, after the step of forming the pixel electrode PE is completed, the reflective layer RL may be further formed on the pixel electrode PE, as shown in FIG. 5. A material of the reflective layer RL may include a metal material with high reflectivity or other suitable materials. For example, the metal material may include silver, aluminum, molybdenum, or other suitable metal, or a stacked layer of at least two of the above metal, but the invention is not limited thereto. The reflective layer RL directly covers a part of the pixel electrode PE, and forms an electrical connection therewith. By now, fabrication of the pixel array substrate is completed. Then, an assembly process is performed on the pixel array substrate and the substrate 200, where the display medium layer 300 is disposed between the pixel array substrate and the substrate 200. Thus, the fabrication of the display panel 10A of the embodiment is completed.

In addition, in some embodiments of the reflective display panel without the transmissive region TA, the pixel electrode PE may also be a reflective electrode, and a material of the reflective electrode may include metals, alloys, nitrides of metal materials, oxides of metal materials, oxynitrides of metal materials, or other suitable materials, or a stacked layer of the metal material and other conductive materials, so that there is no need to additionally form the reflective layer RL on the pixel electrode PE.

Figure 8:
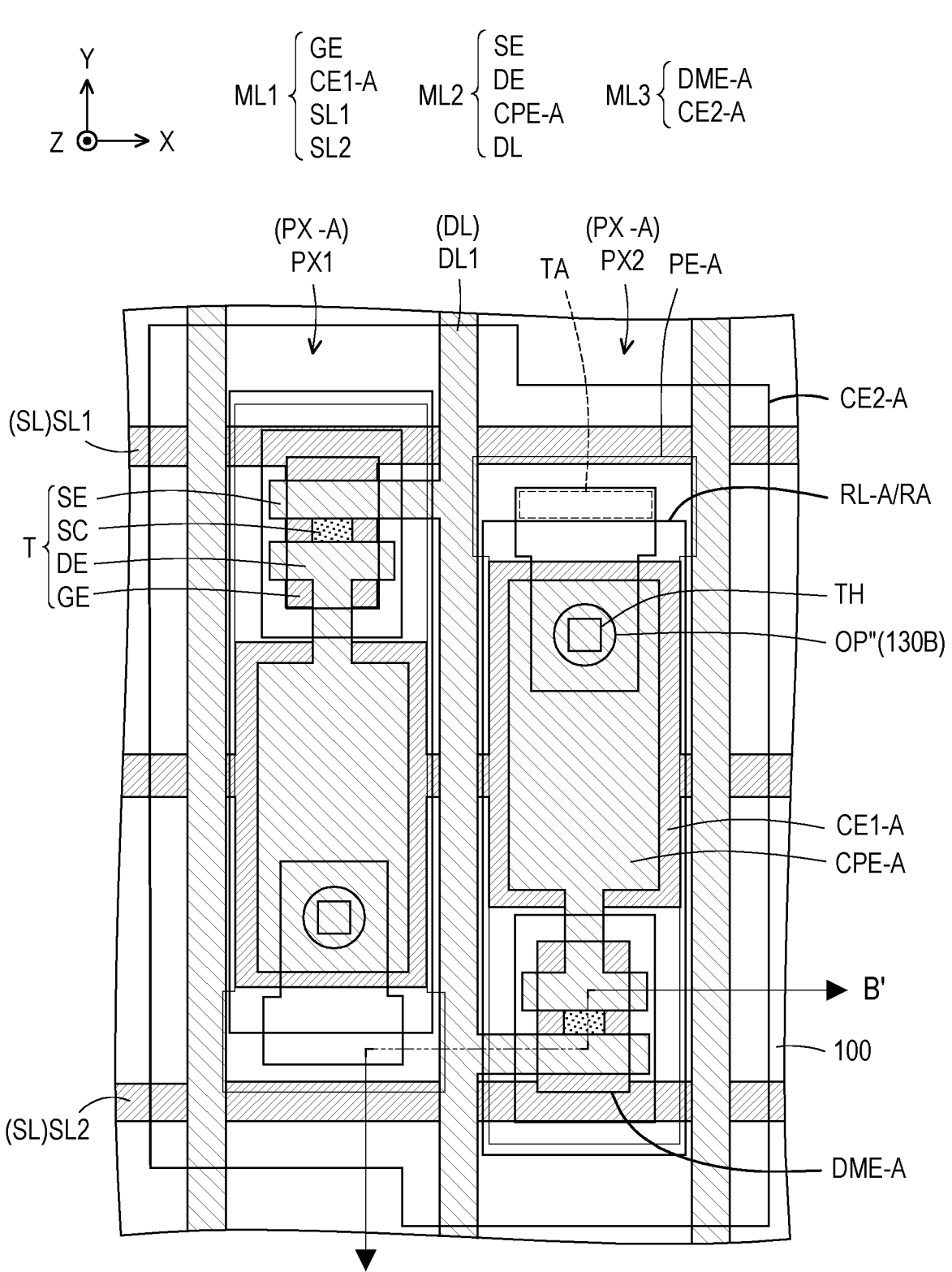
FIG. 8 is a schematic top view of a display panel according to a third embodiment of the invention.
Figure 9:
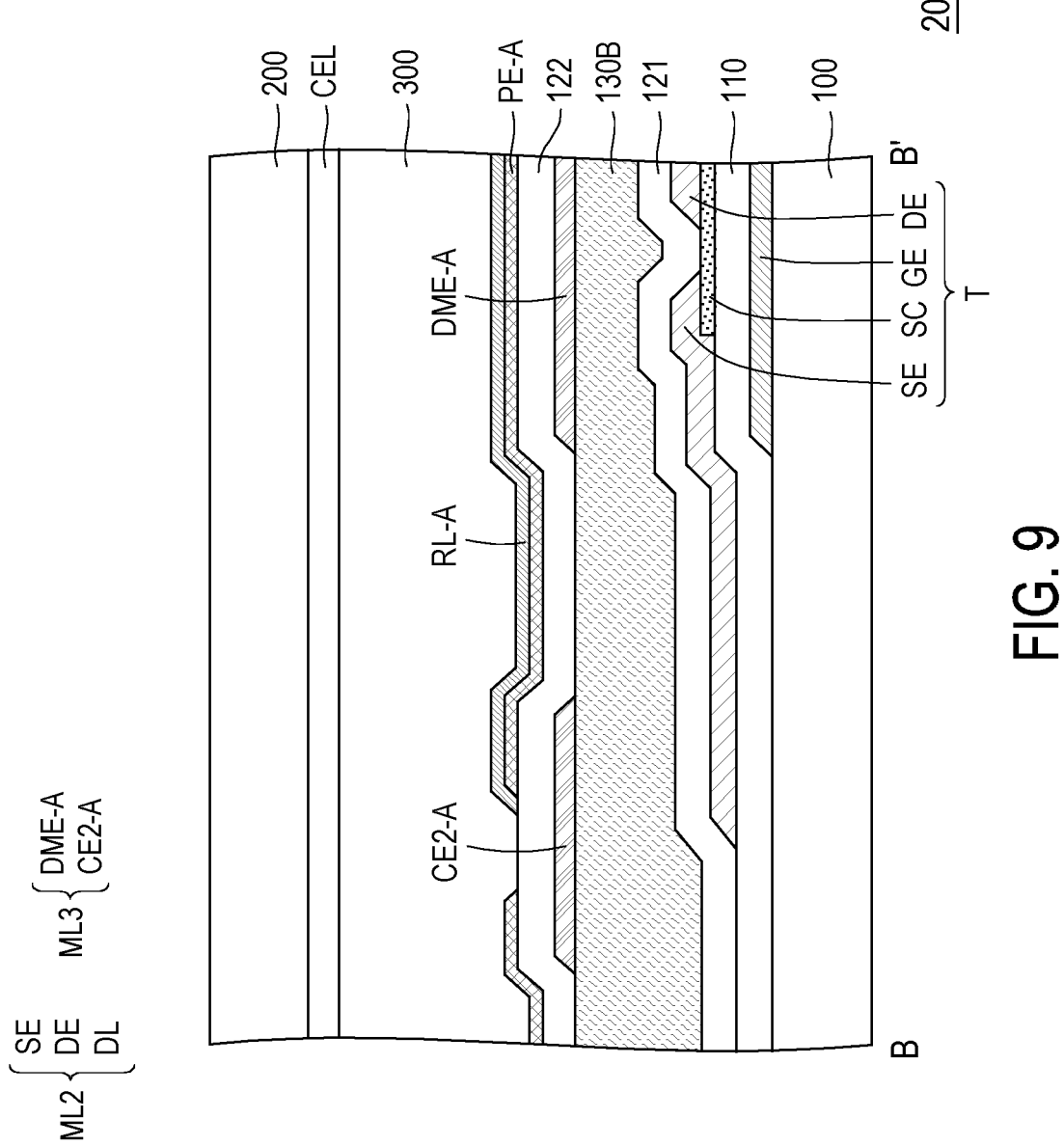
FIG. 9 is a schematic cross-sectional view of the display panel of FIG. 8.

FIG. 8 is a schematic top view of a display panel according to a third embodiment of the invention. FIG. 9 is a schematic cross-sectional view of the display panel of FIG. 8. FIG. 9 corresponds to a section line B-B' in FIG. 8. For clarity's sake, FIG. 8 omits illustration of the substrate 200 and the display medium layer 300 in FIG. 9.

Referring to FIG. 8 and FIG. 9, a pixel structure of a display panel 20 of the embodiment is a dual gate pixel structure. Specifically, in the embodiment, a plurality of pixel structures PX-A of the display panel 20 may include a first pixel structure PX1 and a second pixel structure PX2 arranged along an extending direction of the scan line SL (i.e., the direction X). One data line DL1 among a plurality of data lines DL is disposed between the first pixel structure PX1 and the second pixel structure PX2. It is particularly noted that a first scan line SL1 and a second scan line SL2 of the plurality of scan lines SL are respectively disposed adjacent to each other at two opposite sides of the first pixel structure PX1 and the second pixel structure PX2 along the direction Y. The active device T of the first pixel structure PX1 is electrically connected to the first scan line SL1 and the data line DL1, and the active device T of the second pixel structure PX2 is electrically connected to the second scan line SL2 and the data line DL1.

It should be noted that FIG. 8 only shows one display unit of the display panel 20, and the display panel 20 may be formed by arranging a plurality of the display units. For example, the plurality of data lines DL may be arranged along the direction X, each of the data lines DL may extend in the direction Y, the plurality of first scan lines SL1 and the plurality of second scan lines SL2 may be arranged in alternation along the direction Y, and each of the first and second scan lines SL1, SL2 may extend in the direction X, where the direction X is optionally perpendicular to the direction Y. The plurality of pixel structures PX-A may be respectively arranged in a plurality of columns and rows along the directions X and Y. Specifically, the plurality of pixel structures PX-A of the display panel 20 may be arranged into a plurality of pixel structure columns and a plurality of pixel structure rows, each pixel structure column includes a plurality of pixel structures PX-A sequentially arranged along an extending direction of the data line DL (i.e. the direction Y), and each pixel structure row includes a plurality of pixel structures PX-A sequentially arranged along an extending direction of the scan line SL (i.e. the direction X). One pixel structure row in the plurality of pixel structure rows includes the first pixel structure PX1 and the second pixel structure PX2, and the first pixel structure PX1 and the second pixel structure PX2 are electrically connected to the same data line DL (for example, the data line DL1), and the first pixel structure PX1 and the second pixel structure PX2 are respectively electrically connected to different scan lines SL (for example, the first scan line SL1 and the second scan line SL2).

Since a configuration relationship of the active device T, a first common electrode CE1-A, a capacitor electrode CPE-A, a dummy electrode DME-A, a second common electrode CE2-A, a reflective layer RL-A, the first passivation layer 121, the second passivation layer 122 and an overcoat layer 130B of the pixel structure PX-A and generated technical effects thereof are similar to that of the display panel 10A of FIG. 5, reference may be made to the relevant paragraphs of the aforementioned embodiment for detailed descriptions, and details thereof are not repeated.

Figure 10:
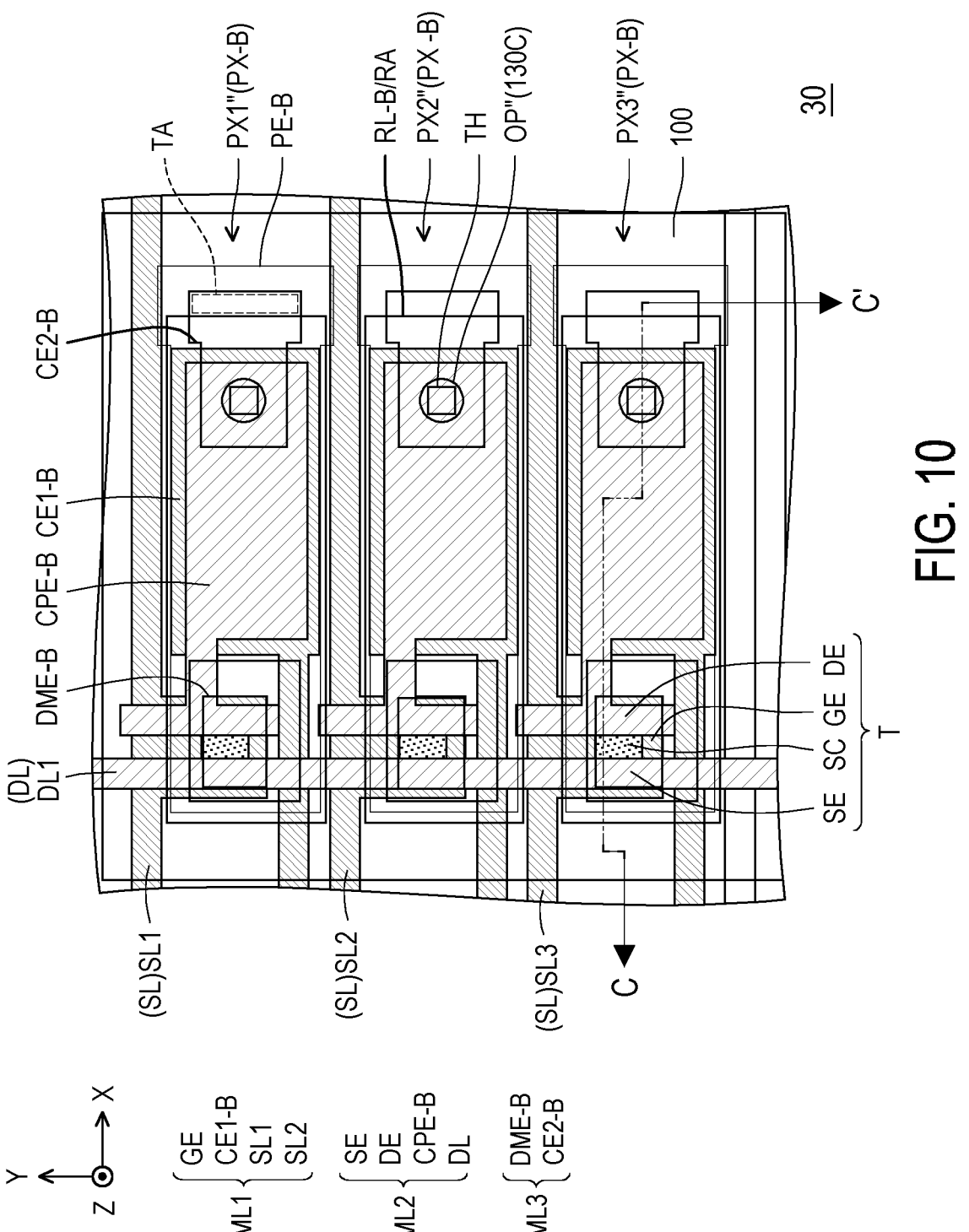
FIG. 10 is a schematic top view of a display panel according to a fourth embodiment of the invention.
Figure 11:
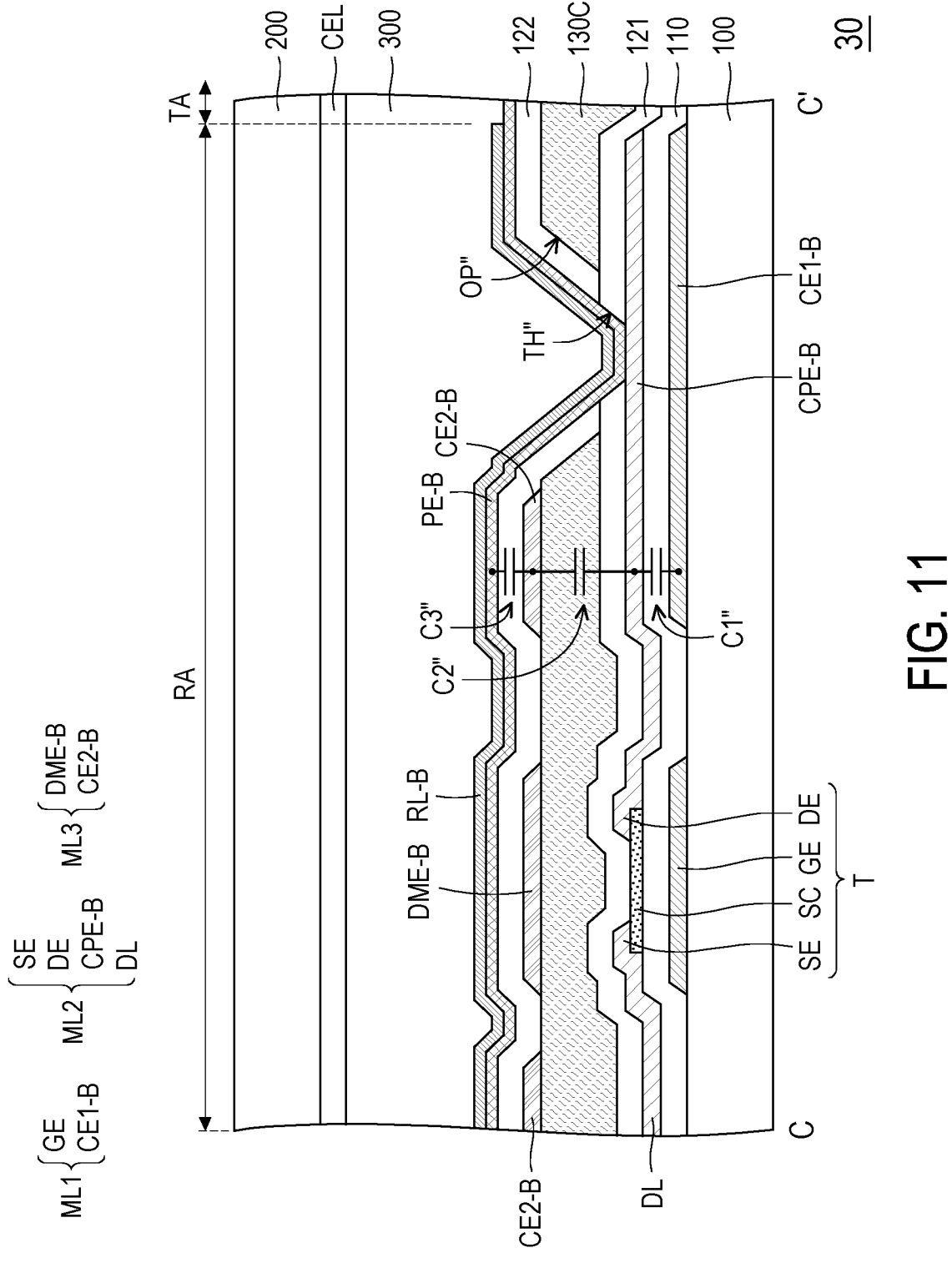
FIG. 11 is a schematic cross-sectional view of the display panel of FIG. 10.

FIG. 10 is a schematic top view of a display panel according to a fourth embodiment of the invention. FIG. 11 is a schematic cross-sectional view of the display panel of FIG. 10. FIG. 11 corresponds to a section line C-C' in FIG. 10. For clarity's sake, FIG. 10 omits illustration of the substrate 200 and the display medium layer 300 in FIG. 11.

Referring to FIG. 10 and FIG. 11, a pixel structures of a display panel 30 of the embodiment and the display panel 10 of FIG. 1 is a triple gate pixel structure. Specifically, in the embodiment, a plurality of pixel structures PX-B of the display panel 30 may include a first pixel structure PX1", a second pixel structure PX2", and a third pixel structure PX3" arranged along the extending direction of the data line DL (i.e. the direction Y). For example, one pixel unit may include the first pixel structure PX1", the second pixel structure PX2" and the third pixel structure PX3", and the first to third pixel structures PX1", PX2", and PX3" may be respectively used to display a first color, a second color, and a third color, and the first to third colors are different from each other (for example, red, green, and blue).

It should be noted that the first pixel structure PX1", the second pixel structure PX2" and the third pixel structure PX3" are provided with one data line DL1 among the plurality of data lines DL on one side of the direction X, and the plurality of scan lines SL include first, second and third scan lines SL1, SL2 and SL3 arranged in alternation along the direction Y with the first pixel structure PX1", the second pixel structure PX2" and the third pixel structure PX3". The active device T of the first pixel structure PX1" is electrically connected to the first scan line SL1 and the data line DL1, the active device T of the second pixel structure PX2" is electrically connected to the second scan line SL2 and the data line DL1, and the active device T of the third pixel structure PX3" is electrically connected to the third scan line SL3 and the data line DL1.

It should be noted that FIG. 10 only shows one display unit of the display panel 30, and the display panel 30 may be formed by arranging a plurality of the display units. For example, the plurality of data lines DL may be arranged along the direction X, each of the data lines DL may extend in the direction Y, the plurality of first scan lines SL1, the plurality of second scan lines SL2, and the plurality of third scan lines SL3 may be arranged in alternation along the direction Y, and each of the first to third scan lines SL1, SL2, SL3 may extend in the direction X, where the direction X is optionally perpendicular to the direction Y. The plurality of pixel structures PX-A may be arranged in a plurality of columns and rows along the directions X and Y, respectively.

Since a configuration relationship of the active device T, a first common electrode CE1-B, a capacitor electrode CPE-B, a dummy electrode DME-B, a second common electrode CE2-B, a reflective layer RL-B, the first passivation layer 121, the second passivation layer 122 and an overcoat layer 130C of the pixel structure PX-B and generated technical effects thereof are similar to that of the display panel 10A of FIG. 5, reference may be made to the relevant paragraphs of the aforementioned embodiment for detailed descriptions, and details thereof are not repeated.

In summary, in the display panel and the manufacturing method thereof according to the embodiments of the invention, the first passivation layer and the overcoat layer are disposed between the second metal layer including the capacitor electrode and the third metal layer including the second common electrode, and the second passivation layer is disposed between the third metal layer and the pixel electrode. Since the distance between the second metal layer and the third metal layer is larger than the distance between the third metal layer and the pixel electrode, in addition to reducing a capacitance coupling effect between the two metal layers, the capacitance coupling effect between the third metal layer and the pixel electrode may also be increased. In addition, by disposing the first passivation layer between the second metal layer and the overcoat layer, a problem of peeling off between the overcoat layer and the second metal layer due to insufficient adhesive force is avoided.

It will be apparent to those skilled in the art that various modifications and variations can be made to the disclosed embodiments without departing from the scope or spirit of the invention. In view of the foregoing, it is intended that the invention covers modifications and variations provided they fall within the scope of the following claims and their equivalents.

What is claimed is:

1. A display panel, comprising:
a substrate;
a plurality of scan lines and a plurality of data lines, disposed on the substrate, and the scan lines being intersected with the data lines; and
a plurality of pixel structures, disposed on the substrate, and electrically connected to the data lines and the scan lines, and the pixel structures respectively comprising:
an active device, having a gate, a source, and a drain, wherein the gate is electrically connected to one of the scan lines, and the source is electrically connected to one of the data lines;
a pixel electrode, electrically connected to the drain of the active device;
a capacitor electrode, extending from the drain, and electrically connected to the pixel electrode;
a common electrode, overlapping the pixel electrode and the capacitor electrode, and located between the capacitor electrode and the pixel electrode;
an overcoat layer, disposed between the common electrode and the capacitor electrode;
a first passivation layer, disposed between the capacitor electrode and the overcoat layer; and
a second passivation layer, disposed between the common electrode and the pixel electrode, wherein the capacitor electrode is electrically coupled to the common electrode and forms a second storage capacitor, the common electrode is electrically coupled to the pixel electrode and forms a third storage capacitor, a capacitance value of the third storage capacitor is greater than a capacitance value of the second storage capacitor.

2. The display panel according to claim 1, wherein the capacitor electrode and the common electrode have a first distance therebetween in a stacking direction, the common electrode and the pixel electrode have a second distance therebetween in the stacking direction, the first distance is greater than the second distance, the stacking direction is perpendicular to an upper surface of the substrate, and the capacitor electrode, and the common electrode and the pixel electrode are disposed above the upper surface of the substrate.

3. The display panel according to claim 2, wherein a sum of a thickness of the overcoat layer and a thickness of the first passivation layer is greater than a thickness of the second passivation layer.

4. The display panel according to claim 1, wherein the common electrode is a second common electrode, each of the pixel structures further comprises a first common electrode overlapping the capacitor electrode, the first common electrode is located between the substrate and the capacitor electrode, and the first common electrode is electrically coupled to the capacitor electrode and forms a first storage capacitor.

5. The display panel according to claim 1, wherein an overlapping area between the common electrode and the pixel electrode is larger than an overlapping area between the common electrode and the capacitor electrode.

6. The display panel according to claim 1, wherein the common electrode further overlaps and covers one of the plurality of data lines.

7. The display panel according to claim 1, wherein each of the pixel structures further comprises a reflective layer electrically connected to the pixel electrode, and each of the pixel structures has a reflective region, wherein in each of the pixel structures, the reflective layer is located in the reflective region, and the reflective layer overlaps and covers at least a part of the pixel electrode in the reflective region.

8. The display panel according to claim 7, wherein each of the pixel structures further has a transmissive region, wherein in each of the pixel structures, the reflective layer overlaps and covers the part of the pixel electrode in the reflective region, and another part of the pixel electrode is located in the transmissive region.

9. A display panel, comprising:
a substrate;
a plurality of scan lines and a plurality of data lines, disposed on the substrate, and the scan lines being intersected with the data lines; and
a plurality of pixel structures, disposed on the substrate, and electrically connected to the data lines and the scan lines, and the pixel structures respectively comprising:
an active device, having a gate, a source, and a drain, wherein the gate is electrically connected to one of the scan lines, and the source is electrically connected to one of the data lines;
a pixel electrode, electrically connected to the drain of the active device;
a capacitor electrode, extending from the drain, and electrically connected to the pixel electrode;
a common electrode, overlapping the pixel electrode and the capacitor electrode, and located between the capacitor electrode and the pixel electrode;
an overcoat layer, disposed between the common electrode and the capacitor electrode;
a first passivation layer, disposed between the capacitor electrode and the overcoat layer; and a second passivation layer, disposed between the common electrode and the pixel electrode, wherein the first passivation layer and the second passivation layer have a contact hole, the contact hole exposes a part of the capacitor electrode, the pixel electrode is electrically connected with the capacitor electrode through the contact hole, the overcoat layer has an opening overlapping the capacitor electrode, and the second passivation layer and the pixel electrode extend into the opening.

10. A manufacturing method of a display panel, comprising:
forming a metal layer on a substrate, wherein the metal layer comprises a capacitor electrode;
forming a first passivation material layer on the metal layer;
forming an overcoat layer on the first passivation material layer, wherein the overcoat layer has an opening overlapping the capacitor electrode, and the opening exposes a part of the first passivation material layer;
forming another metal layer on the overcoat layer, wherein the another metal layer comprises a common electrode, and the common electrode overlaps the capacitor electrode;
forming a second passivation material layer on the another metal layer, wherein the second passivation material layer extends into the opening and covers the first passivation material layer;
etching the first passivation material layer and the second passivation material layer to form a first passivation layer and a second passivation layer having a contact hole, wherein the contact hole exposes a part of the capacitor electrode; and
forming a pixel electrode on the second passivation layer, wherein the pixel electrode extends into the opening and is electrically connected with the capacitor electrode through the contact hole.

11. The manufacturing method according to claim 10, wherein the metal layer is a second metal layer, the common electrode is a second common electrode, and the another metal layer is a third metal layer, wherein before the step of forming the second metal layer, the manufacturing method further comprises:
forming a first metal layer on the substrate, wherein the first metal layer comprises a first common electrode; and
forming an insulating layer on the first metal layer, wherein the second metal layer is located on the insulating layer.

12. The manufacturing method according to claim 10, wherein a material of the overcoat layer comprises a photosensitive material, and the step of forming the overcoat layer comprises:
forming an overcoat material layer on the first passivation layer; and
performing an exposure process and a development process on the overcoat material layer and removing a part of the overcoat material layer to form the opening.

13. The manufacturing method according to claim 10, wherein the step of etching the first passivation material layer and the second passivation material layer to form the contact hole is performed in a same lithography and etching process.

14. The manufacturing method according to claim 10, further comprising:

forming a reflective layer on the pixel electrode, wherein the reflective layer is electrically connected to the pixel electrode.

\* \* \* \* \*